US006762955B2

(12) United States Patent
Sakui et al.

(10) Patent No.: US 6,762,955 B2
(45) Date of Patent: Jul. 13, 2004

(54) NONVOLATILE SEMICONDUCTOR MEMORY HAVING CONTROL GATE WITH TOP FLAT SURFACE COVERING STORAGE LAYERS OF TWO ADJACENT TRANSISTORS

(75) Inventors: Koji Sakui, Setagaya-ku (JP); Toshiharu Watanabe, Herndon, VA (US)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/422,900

(22) Filed: Apr. 25, 2003

(65) Prior Publication Data

US 2003/0206443 A1 Nov. 6, 2003

Related U.S. Application Data

(63) Continuation of application No. 09/814,711, filed on Mar. 23, 2001, now Pat. No. 6,577,533.

(30) Foreign Application Priority Data

Mar. 28, 2000 (JP) .......................................... 2000-89100

(51) Int. Cl.[7] .............................................. G11C 16/04
(52) U.S. Cl. ............................ 365/185.05; 365/185.01; 365/185.11; 257/317; 257/318
(58) Field of Search ....................... 365/185.05, 185.01, 365/185.11, 230.03; 257/315, 316, 317, 318

(56) References Cited

U.S. PATENT DOCUMENTS 5,943,267 A * 8/1999 Sekariapuram et al. 365/185.28

6,312,989 B1 * 11/2001 Hsieh et al. ................. 438/257
6,424,002 B1 * 7/2002 Kondo et al. ................ 257/316

FOREIGN PATENT DOCUMENTS

JP 7-045797 2/1995

OTHER PUBLICATIONS

Kang–Deog Suh, et al., "A 3.3 V 32 Mb NAND Flash Memory With Incremental Step Pulse Programming Scheme," IEEE Journal of Solid–State Circuits, vol. 30, No. 11, Nov. 1995, pp. 1149–1156.

Yoshihisa Iwata, et al., "A 35 ns Cycle Time 3.3 V only 32 Mb NAND Flash EEPROM," IEEE Journal of Solid–State Circuits, vol. 30, No. 11, Nov. 1995, pp. 1157–1164.

R. Stewart, et al., "A High Density EPROM Cell And Array," Symposium VLSI Technology, Dig. Papers, Jun. 1986, pp. 89–90.

* cited by examiner

Primary Examiner—Son T. Dinh
(74) Attorney, Agent, or Firm—Oblon, Spivak, McClelland, Maier & Neustadt, P.C.

(57) ABSTRACT

A nonvolatile semiconductor memory includes rewritable nonvolatile memory cell transistors connected in series. The nonvolatile memory cell transistors includes at least two charge storage layers formed on a first insulating film, a control gate shared by two adjacent transistors which are two of the nonvolatile memory cell transistors and which are adjacent to each other, and a second insulating film formed between the at least two charge storage layers and the control gate. A top of the control gate has a flat surface that covers the at least two charge storage layers that correspond to the two adjacent transistors, and the flat surface extends from one of the at least two charge storage layers to the other of the at least two charge storage layers.

16 Claims, 45 Drawing Sheets

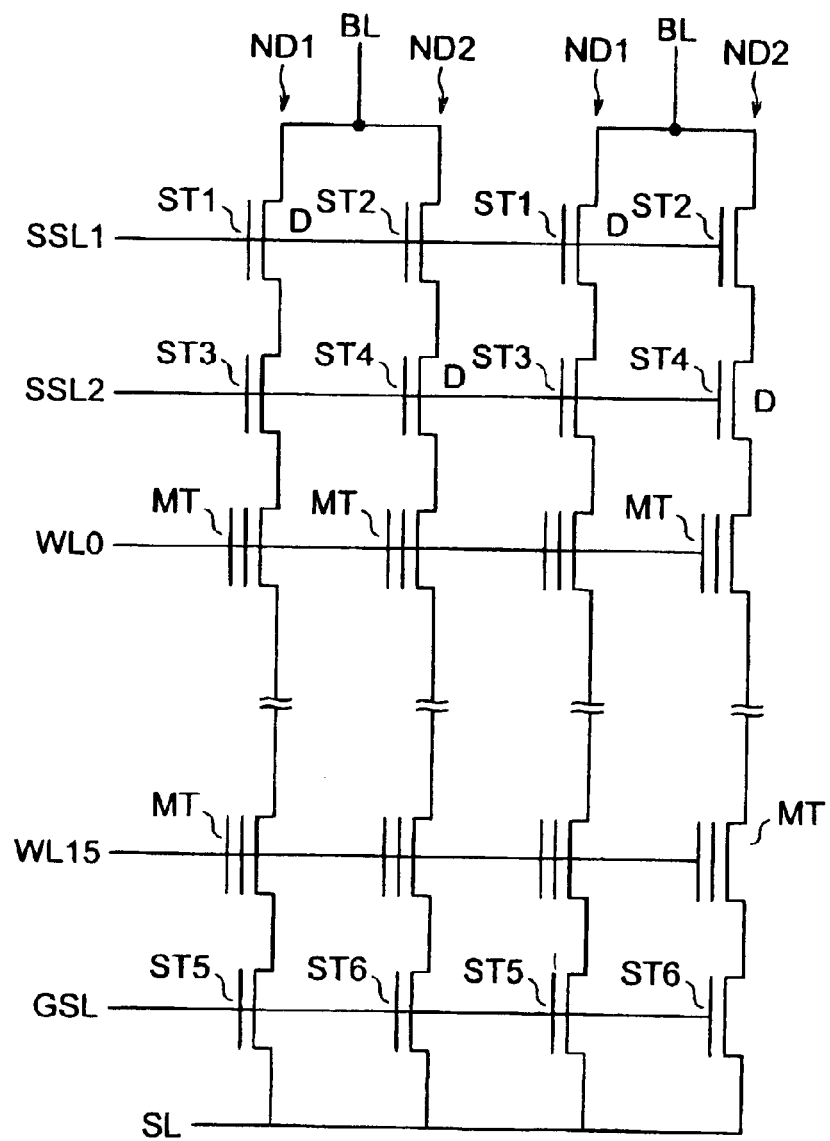
F I G. 1

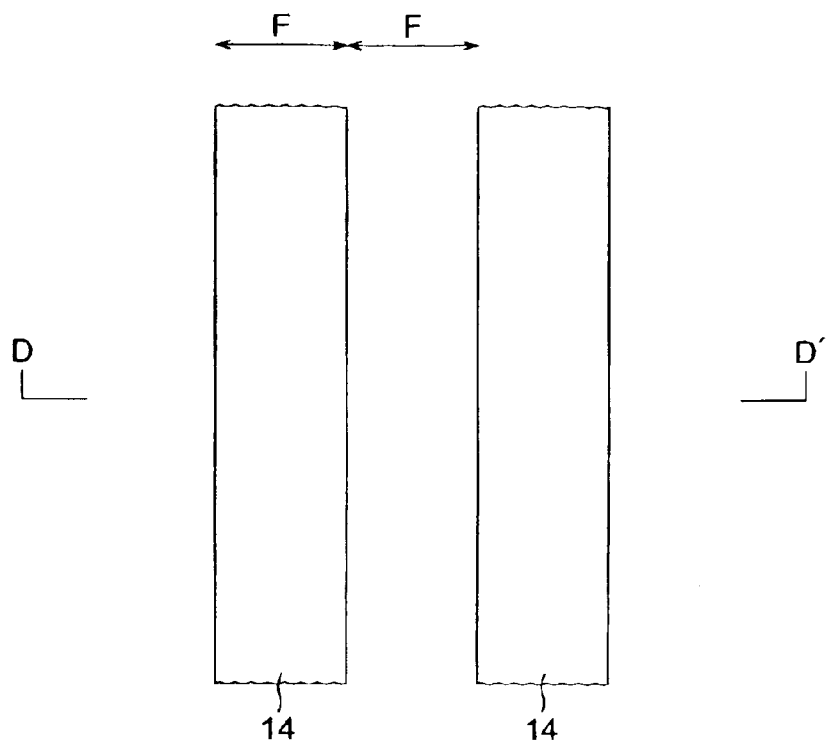
F I G. 10A
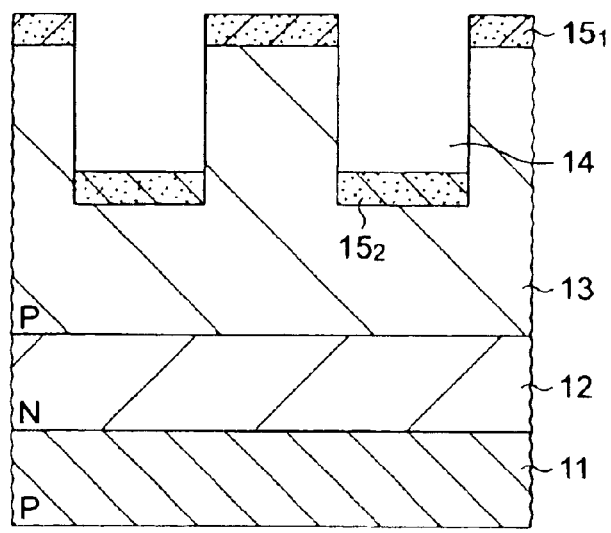
F I G. 10B

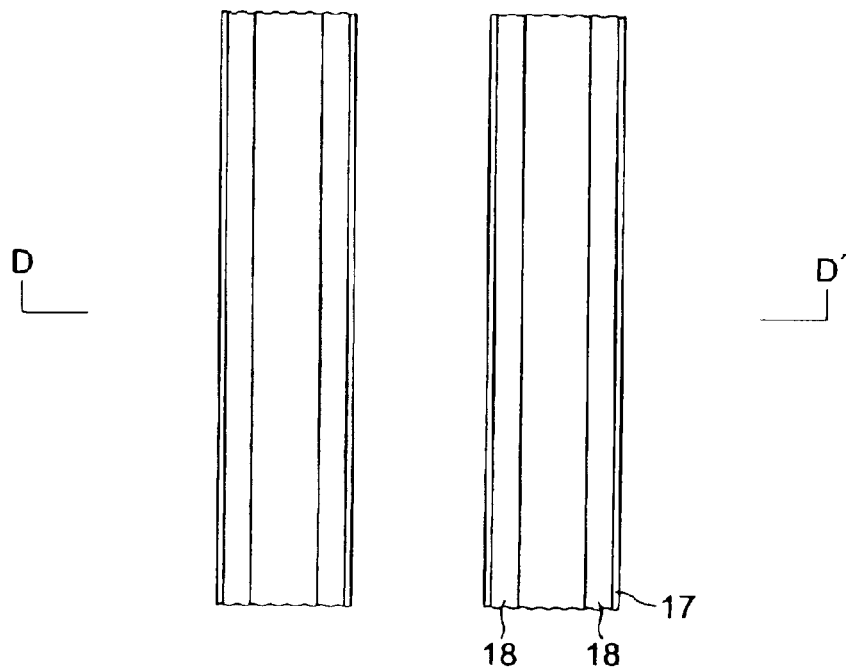
F I G. 14A
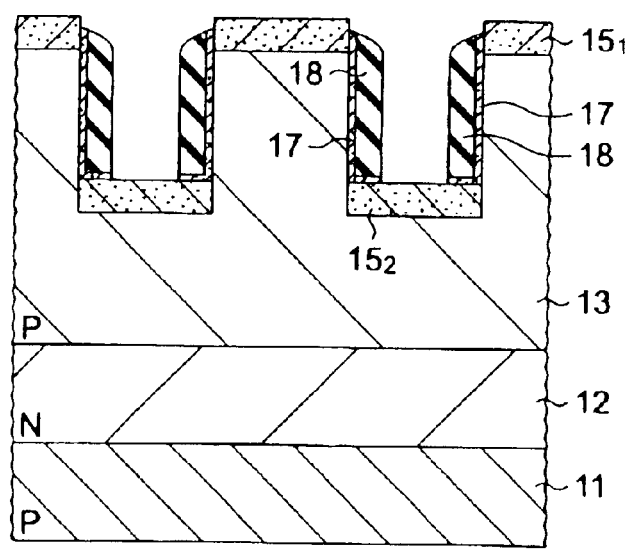
F I G. 14B

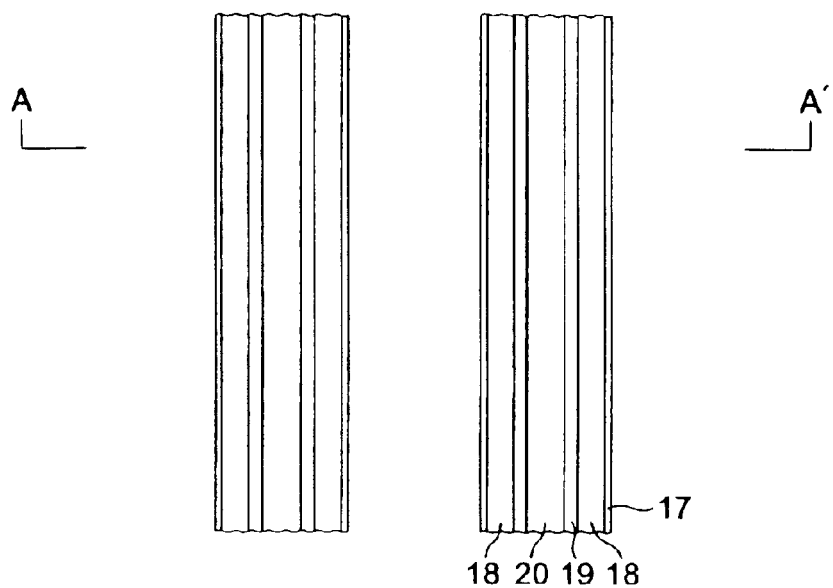
F I G. 15A
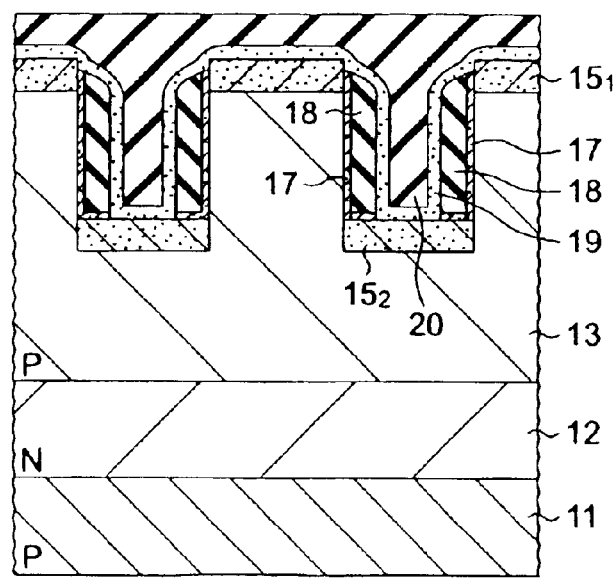
F I G. 15B

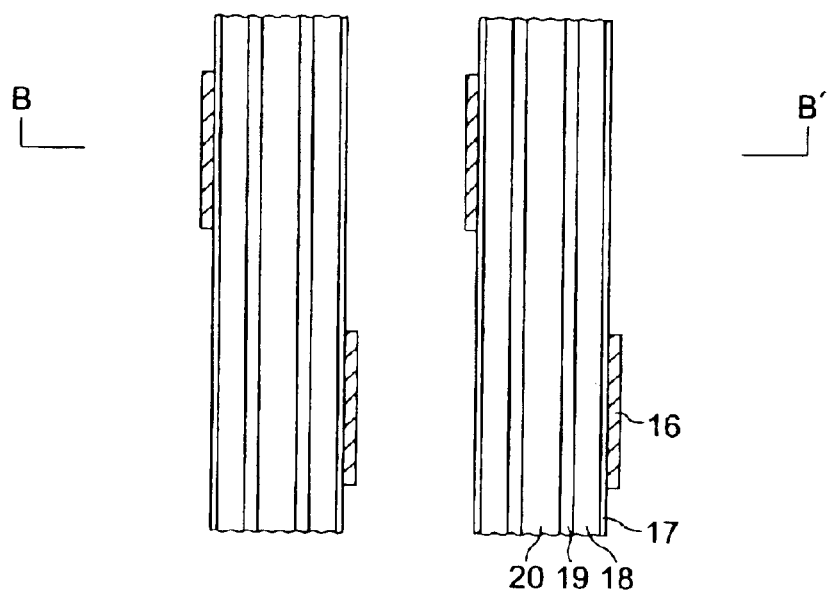
F I G. 16A
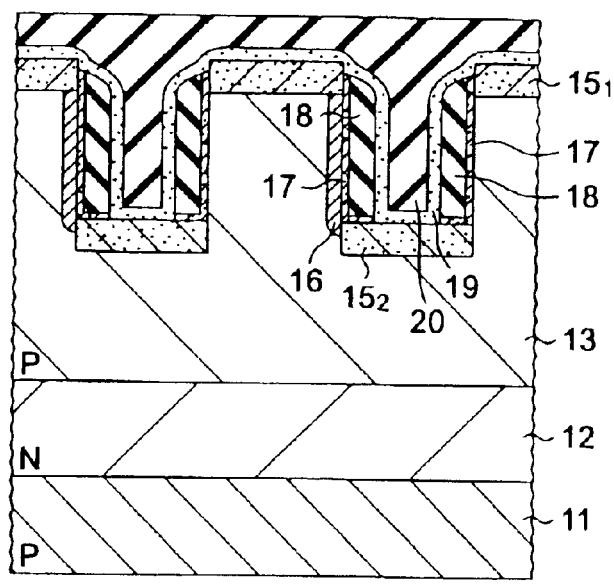
F I G. 16B

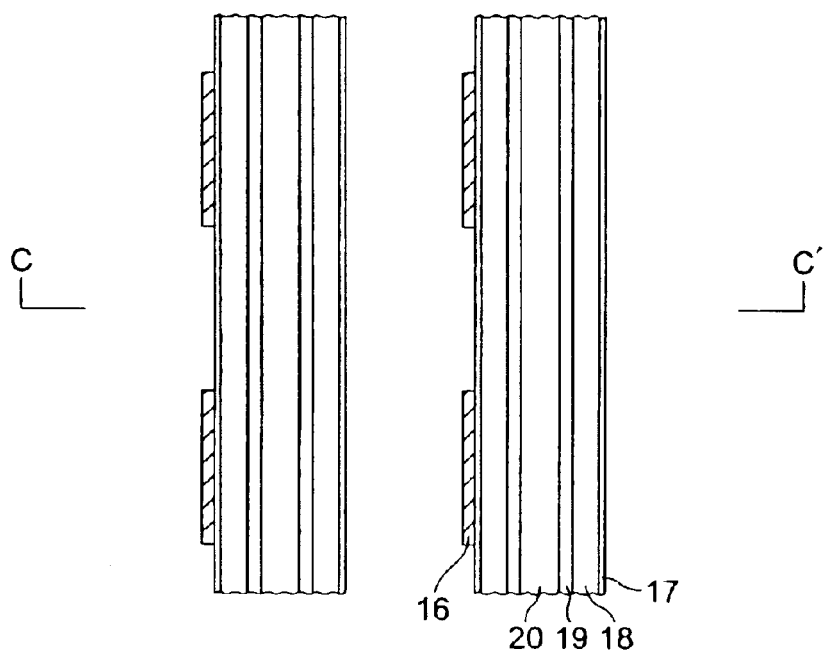
F I G. 17A
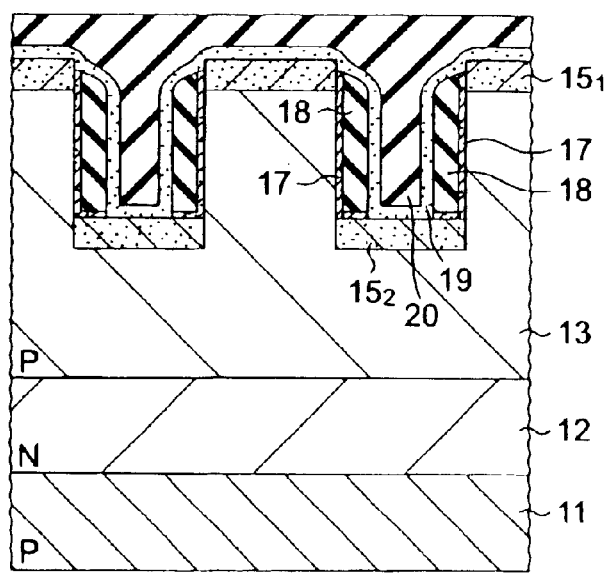
F I G. 17B

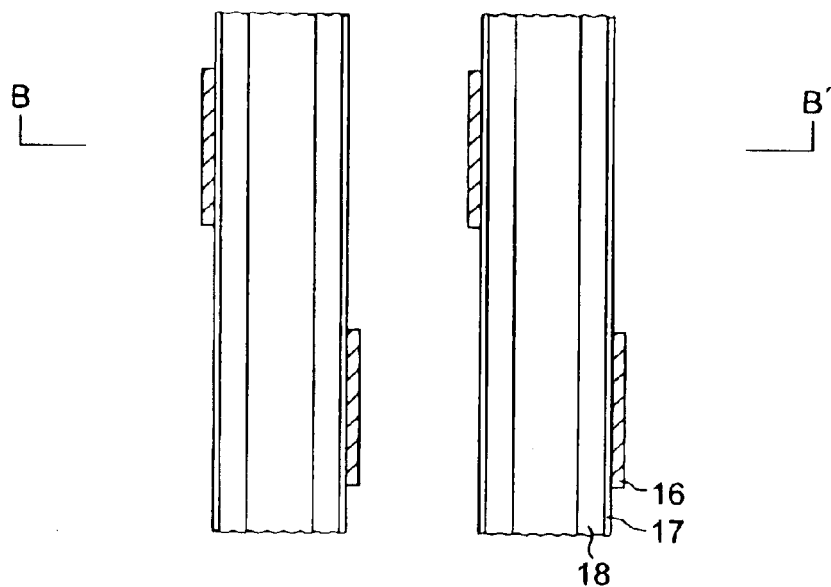
F I G. 20A
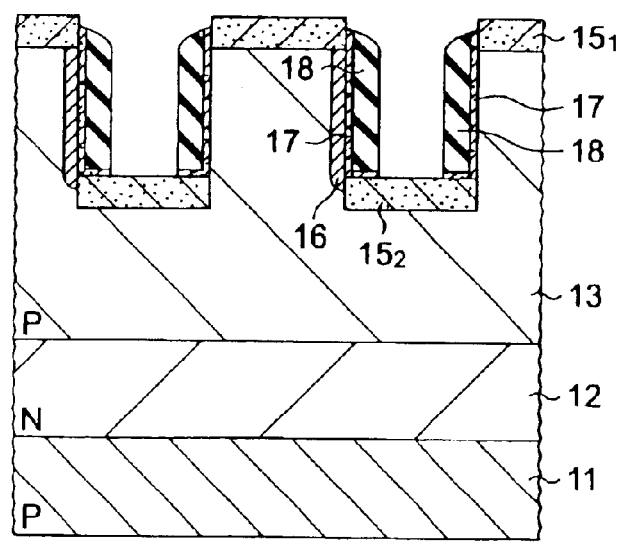
F I G. 20B

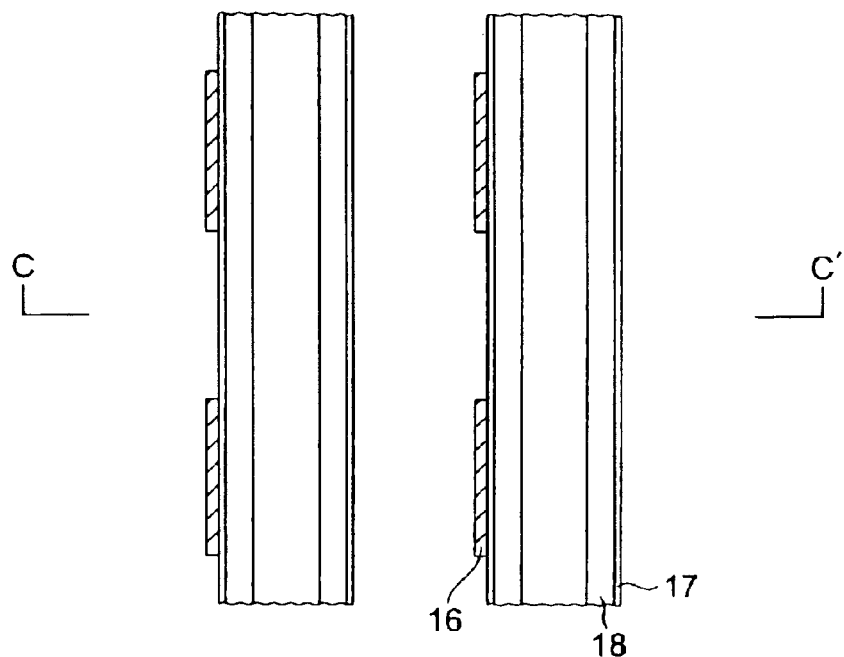
F I G. 21A
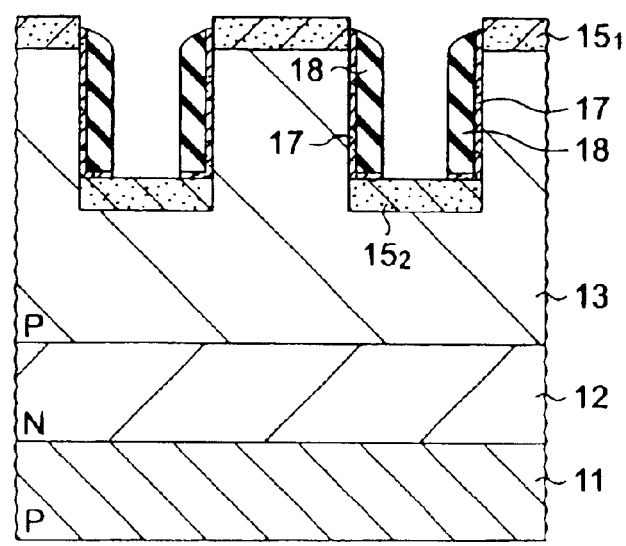
F I G. 21B

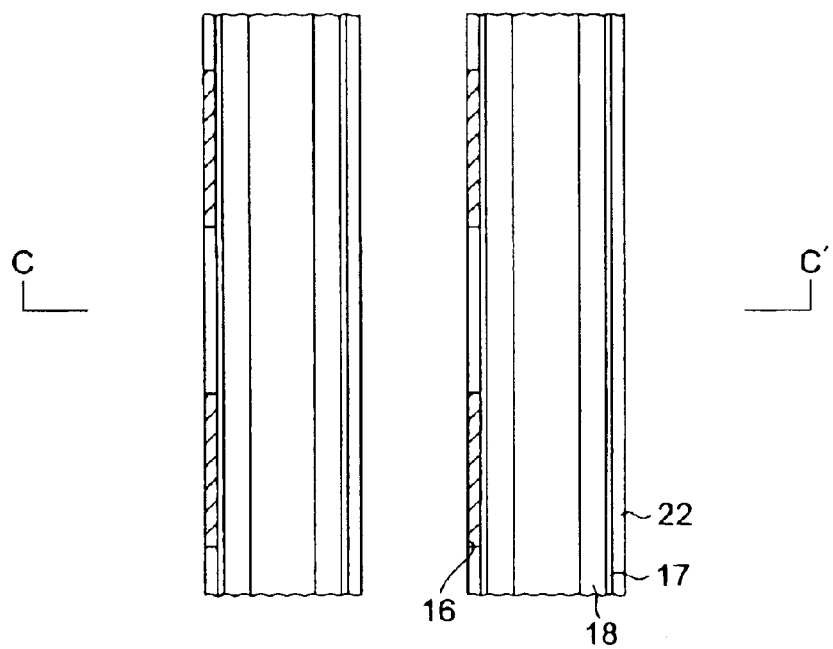
F I G. 25A
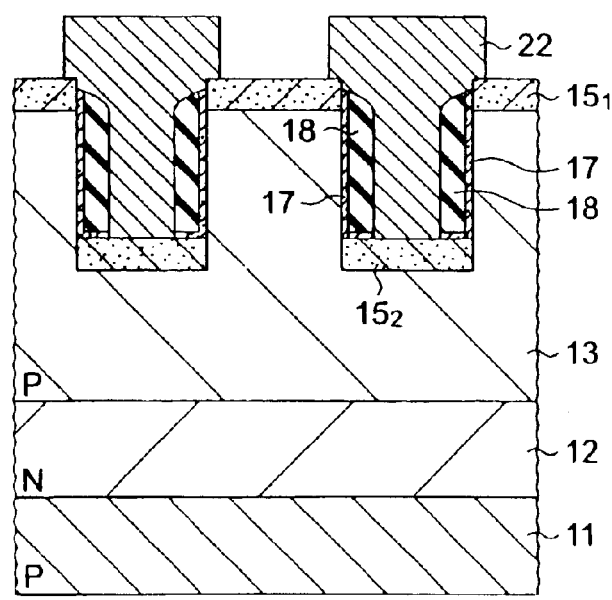
F I G. 25B

F I G. 34A
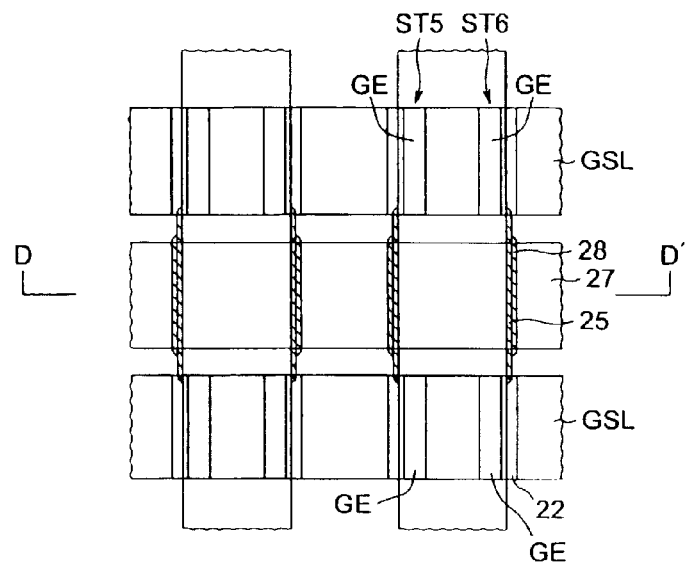
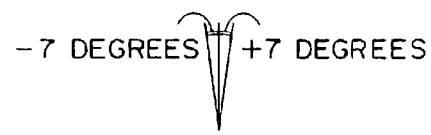
F I G. 34B
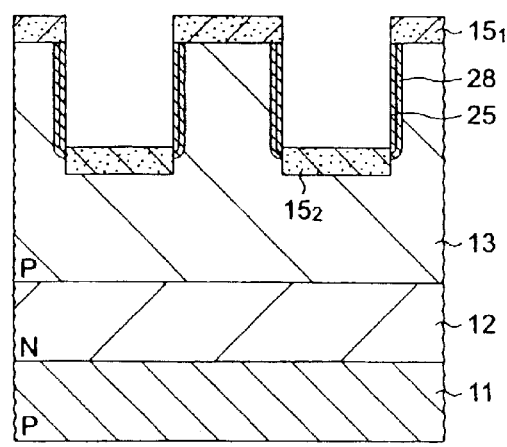

| | ERASE | READ | WRITE |
|---|---|---|---|
| SELECTED WORD LINE | 0 | 0 | 18 |
| NON-SELECTED WORD LINE (EXCEPT WLi) WL0 ~ WL15 | 0 | 4.5 | 10 |
| SELECT GATE LINE SSL1 | F | 0 | 0 |
| SELECT GATE LINE SSL2 | F | 4.5 | 3.5(Vcc) |
| SELECT GATE LINE GSL | F | 4.5 | 0 |
| "0" WRITING BIT LINE BL0 | F | 1.8 | 0 |
| "1" WRITING BIT LINE BL1 | F | 0.7 | 3.5(Vcc) |
| MEMORY CELL P-TYPE WELL | 21 | 0 | 0 |

FIG. 35

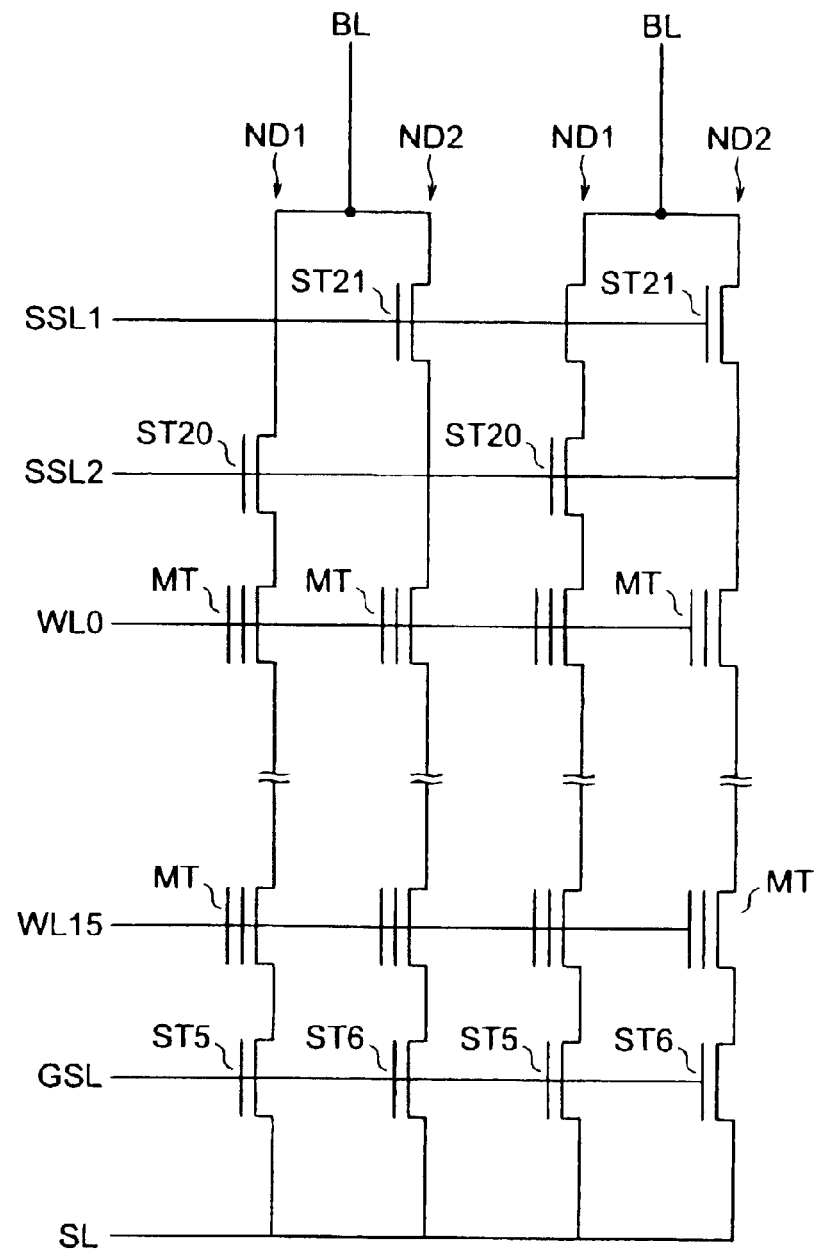
F I G. 40

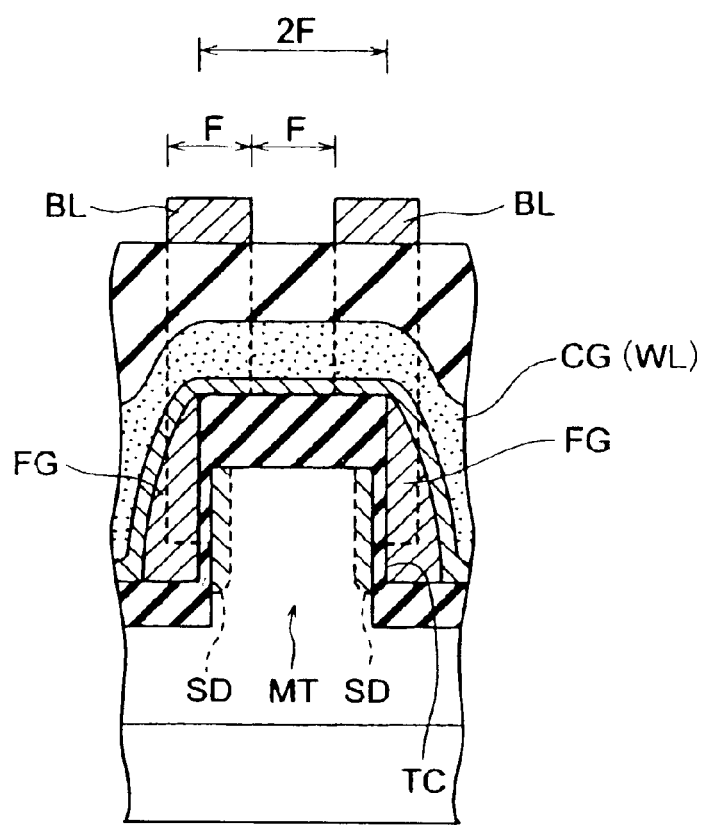
F I G. 45

009# NONVOLATILE SEMICONDUCTOR MEMORY HAVING CONTROL GATE WITH TOP FLAT SURFACE COVERING STORAGE LAYERS OF TWO ADJACENT TRANSISTORS

CROSS REFERENCE TO RELATED APPLICATION

This application is a Continuation of U.S. patent application Ser. No. 09/814,711 filed Mar. 23, 2001, now U.S. Pat. No. 6,577,533 and claims benefit of priority under 35 U.S.C. §119 to Jananese Patent Application No. 2000-89100, filed on Mar. 28, 2000, the entire contents of which are incorporated by reference herein.

BACKGROUND OF THE INVENTION

1. Field of the Invention

The present invention relates to a nonvolatile semiconductor memory and a method of manufacturing the same, and particularly relates to a nonvolatile semiconductor memory having a NAND-type memory cell unit structured by connecting a plurality of memory cell transistors in series and a method of manufacturing the same.

2. Related Background Art

An EEPROM which enables electrical rewrite has been hitherto known as one of semiconductor memories. Especially, a NAND-type EEPROM in which a NAND-type memory cell unit is structured by connecting a plurality of memory cell transistors in series has attracted considerable attention as one capable of high integration.

FIG. 41 is a diagram showing an equivalent circuit of the NAND-type memory cell unit, and FIG. 42 is a diagram showing the structure of a memory cell portion of the NAND-type memory cell unit in plan view. This example in FIG. 42 shows the NAND-type memory cell unit in the case where STI (Shallow Trench Isolation) is used for isolating elements.

One memory cell transistor MT of the NAND-type EEPROM has an FETMOS structure in which a floating gate FG (a charge storage layer) and a control gate CG are stacked with an insulating film therebetween above a semiconductor substrate, a plurality of memory cell transistors are connected in series with their respective adjoining ones sharing a source/drain to constitute the NAND-type memory cell unit. The NAND-type memory cell units like this are arranged in a matrix form to constitute a memory cell array.

A drain D at one end side of the NAND-type memory cell unit is connected to a bit line BL via a select gate transistor ST31, while a source at the other end side of the NAND-type memory cell unit is connected to a common source line SL via a select gate transistor ST32. The control gate CG of the memory cell transistor MT and gate electrodes of the select gate transistors ST31 and ST32 are respectively connected to compose a word line WL and a select gate line in a direction perpendicular to the direction of the bit line BL.

As shown in FIG. 42, in the NAND-type EEPROM, one source/drain line formed out of a diffusion layer in a silicon active region is formed for one bit line BL. Namely, one NAND-type memory cell unit is formed for one bit line BL. Assuming that a design rule is F (Feature size), the line/space of the bit line BL is 1 F/1 F, and the line/space of the word line WL is also 1 F/1 F. Therefore, the cell size of one memory cell transistor MT is 2 F×2 F=4 F². Since the select gate transistors ST31 and ST32 are provided in one NAND-type memory cell unit, the substantial one cell size is 4 F²+α if the sizes of these select gate transistors ST31 and ST32 are taken into account as an overhead α.

As a widely known example of such a NAND-type EEPROM, there are reports such as "A 3.3 V 32 MB NAND Flash Memory with Incremental Step Pulse Programming Scheme" by K.-D. Suh et al. in IEEE J. Solid-State Circuits, vol. 30, pp. 1149–1156, November 1995 and "A 35 ns Cycle Time 3.3 V Only 32 MB NAND Flash EEPROM" by Y. Iwata et. al. in IEEE J. Solid-State Circuits, vol. 30, pp. 1157–1164, 1995. In these references, the operation of a related NAND-type EEPROM is explained.

FIG. 43 is a diagram showing an equivalent circuit of a nonvolatile semiconductor memory having AND-type memory cell units, and FIG. 44 is a diagram showing the structure of a memory cell portion of the AND memory cell unit in plan view.

The name of an AND type originates in that its connection mode is the same parallel connection as an NOR type and that its logic mode is inverse to the NOR type. Namely, as shown in FIG. 43, the AND-type memory cell unit has a sub-bit line SBBL and a sub-source line SBSL, and a plurality of memory cell transistors MT are connected in parallel between the sub-bit line SBBL and the sub-source line SBSL. For example, in the case of a 64 Mbits AND-type nonvolatile semiconductor memory, 128 memory cell transistors are connected in parallel in one AND-type memory cell unit.

The sub-bit line SBBL is connected to a main bit line MBL via a select gate transistor ST41. The sub-source line SBSL is connected to a main source line MSL via a select gate transistor ST42.

A memory cell array composed of these AND-type memory cell units is characterized by its pseudo contactless structure, in which the main bit line MBL and word lines WL are made hierarchical and the sub-bit line SBBL and the sub-source line SBSL are formed out of a diffusion layer writing/erase into/from the memory cell transistor MT is performed by an FN (Fowler-Nordheim) tunnel current. Specifically, the writing to the memory cell transistor MT is performed by extracting electrons in the floating gate FG to the drain side by the use of the FN tunnel current. The erase from the memory cell transistor MT is performed by injecting electrons from the semiconductor substrate to the floating gate FG by the FN tunnel current on the entire surface of a channel.

As shown in FIG. 44, in the AND-type memory cell unit, two lines in total, i.e. the sub-source line SBSL and the sub-bit line SBBL formed of the diffusion layer in the silicon active region, are formed for one main bit line MBL. Hence, the line/space of each of the sub-source line SBSL and the sub-bit line SBBL is 1 F/1 F, and the line/space of the word line WL is also 1 F/1 F. Consequently, the cell size of one memory cell transistor MT is 2 F×4 F=8 F². Moreover, since the select gate transistors ST41 and ST42 are provided in one AND memory cell unit, the substantial one cell size is 8 F²+α if the sizes of these select gate transistors ST41 and ST42 are taken into account as an overhead α.

Meanwhile, Japanese Patent Laid-open No. Hei 7-45797 discloses a nonvolatile semiconductor memory in which a vertical NAND memory cell unit is formed in a side wall portion of a trench in order to reduce one cell size. FIG. 45 is a diagram showing a cross section of a memory cell transistor MT portion of the nonvolatile semiconductor memory disclosed in this Japanese Patent Laid-open No. Hei 7-45797.

As shown in FIG. 45, in this nonvolatile semiconductor memory, a trench region TC is formed on a semiconductor substrate, and memory cell transistors MT are formed respectively on both side wall portions of this trench region TC. In this case, the floating gates FG are formed along a side wall on the inside of the trench region TC, and source/drains SD are formed as a diffusion layer along a side wall of the trench region TC of the semiconductor substrate. Namely, in this NAND-type memory cell unit, a plurality of memory cell transistors MT are each formed along the side wall of the trench region TC, and thus a source/drain current flows along the side wall of the trench region TC. The bit line BL is formed via an interlayer dielectric for each NAND-type memory cell unit. The line/space of this bit line BL is 1 F/1 F.

In order to attain higher integration, however, it is necessary to lay two source-drain lines formed in silicon active regions within a 2 F bit line pitch and to effectively reduce the memory cell size by half.

SUMMARY OF THE INVENTION

The present invention is made in view of the aforesaid problems. An object of the present invention is to three-dimensionally make an NAND-type EEPROM and lay two source/drain lines in silicon active regions within 2 F bit line pitch, that is, to provide two NAND-type memory cell units for one bit line, and thereby to provide a nonvolatile semiconductor memory capable of reducing the memory cell size by half, resulting in a reduction in bit cost and to provide a method of manufacturing the same.

In order to accomplish the aforementioned and other objects, according to one aspect of the present invention, a nonvolatile semiconductor memory includes a memory cell array having a plurality of memory cell units, one of which has a plurality of rewritable nonvolatile memory cell transistors connected in series, the nonvolatile memory cell transistors having a first insulating film formed on a substrate; a charge storage layer formed on the first insulating film; a control gate shared with two adjacent transistors which are two of the nonvolatile memory cell transistors and which are adjacent to each other; and a second insulating film formed between the charge storage layer and the control gate, both a bottom of the charge storage layer and a bottom of the second insulating film being on a face which is substantially parallel with a surface of the substrate.

wherein the NAND-type memory cell units are formed in pairs along both side wall portions of a trench formed in a substrate, two of the nonvolatile memory cell transistors which face each other on the side wall portions of the trench share the one control gate which is formed to extend in a depth direction of the trench, and the control gate is formed to fill a space formed by an insulating film which covers the two charge storage layers facing each other on the side wall portions of the trench, and electrically connected to a word line which extends continuously.

In order to accomplish the aforementioned and other objects, according to one aspect of the present invention, a nonvolatile semiconductor memory comprising a plurality of NAND-type memory cell units, each of which includes:

a NAND-type memory cell column having a plurality of rewritable nonvolatile memory cell transistors connected in series, each of which has a charge storage layer and a control gate;

a bit line side switching portion connected between the memory cell column and a bit line; and a source line side switching portion connected between the memory cell column and a source line, wherein the NAND-type memory cell units are formed in pairs along both side wall portions of a trench formed in a substrate, and wherein two of NAND-type memory cell units of the pair are respectively connected to the identical bit line via the bit line switch.

According to a further aspect of the present invention, a method of manufacturing a nonvolatile semiconductor memory including a memory cell array having a plurality of NAND-type memory cell units, each of which has a plurality of rewritable nonvolatile memory cell transistors connected in series, each of which has a charge storage layer and a control gate, the method comprising the steps of:

forming a trench in a substrate;

forming first insulating films on both side wall portions of the trench;

forming a pair of the charge storage layers on surface sides of the first insulating films formed on both the side wall portions of the trench;

forming a second insulating film so as to cover the pair of charge storage layers on surface sides of the pair of charge storage layers formed on both the side wall portions of the trench;

forming the control gate shared by the pair of charge storage layers so as to fill a space formed by the second insulating film; and forming a word line which is electrically connected to the control gate and extends continuously.

According to a still further aspect of the present invention, a method of manufacturing a nonvolatile semiconductor memory including a memory cell array having a plurality of NAND-type memory cell units, each of which has a plurality of rewritable nonvolatile memory cell transistors connected in series, each of which has a charge storage layer and a control gate, the method comprising the steps of:

forming a trench in a substrate;

forming first insulating films for memory cell transistors on both side wall portions of the trench;

forming first insulating films for select gate transistors on both side wall portions of the trench;

forming a pair of the charge storage layers on surface sides of the first insulating films for the memory cell transistors formed on both the side wall portions of the trench;

forming a pair of first gate electrodes on surface sides of the first insulating films for the select gate transistors formed on both the side wall portions of the trench;

forming a second insulating film so as to cover the pair of charge storage layers on surface sides of the pair of charge storage layers formed on both the side wall portions of the trench;

forming the control gate shared by the pair of charge storage layers so as to fill a space formed by the second insulating film;

forming a second gate electrode shared by the pair of first gate electrodes so as to fill a space between the pair of first gate electrodes;

forming a word line which is electrically connected to the control gate and extends continuously; and forming a select gate line which is electrically connected to the second gate electrode and extends continuously.

BRIEF DESCRIPTION OF THE DRAWINGS

FIG. 1 is a diagram showing an equivalent circuit of a cell array of a NAND-type EEPROM in a nonvolatile semiconductor memory according to the present embodiment;

FIG. 10A is a schematic diagram showing a state of a manufacturing process of the source line contact portion in FIG. 2 in plan view, and FIG. 10B is a diagram showing a cross section thereof taken along the line D–D' (First state);

FIG. 14A is a schematic diagram showing a state of the manufacturing process of the source line contact portion in FIG. 2 in plan view, and FIG. 14B is a diagram showing a cross section thereof taken along the line D–D' (Second state);

FIG. 15A is a schematic diagram showing a state of the manufacturing process of the memory cell transistor portion in FIG. 2 in plan view, and FIG. 15B is a diagram showing a cross section thereof taken along the line A–A' (Third state);

FIG. 16A is a schematic diagram showing a state of the manufacturing process of the select gate transistor portion in FIG. 2 in plan view, and FIG. 16B is a diagram showing a cross section thereof taken along the line B–B' (Third state);

FIG. 17A is a schematic diagram showing a state of the manufacturing process of the bit line contact portion in FIG. 2 in plan view, and FIG. 17B is a diagram showing a cross section thereof taken along the line C–C' (Third state);

FIG. 20A is a schematic diagram showing a state of the manufacturing process of the select gate transistor portion in FIG. 2 in plan view, and FIG. 20B is a diagram showing a cross section thereof taken along the line B–B' (Fourth state);

FIG. 21A is a schematic diagram showing a state of the manufacturing process of the bit line contact portion in FIG. 2 in plan view, and FIG. 21B is a diagram showing a cross section thereof taken along the line C–C' (Fourth state);

FIG. 25A is a schematic diagram showing a state of the manufacturing process of the bit line contact portion in FIG. 2 in plan view, and FIG. 25B is a diagram showing a cross section thereof taken along the line C–C' (Fifth state);

FIG. 34A is a schematic diagram showing a state of the manufacturing process of the source line contact portion in FIG. 2 in plan view, and FIG. 34B is a diagram showing a cross section thereof taken along the line D–D' (Seventh state);

FIG. 35 is a diagram showing voltage relationship when the nonvolatile semiconductor memory according to this embodiment is operated;

FIG. 40 is a circuit diagram when the NAND-type memory cell unit shown in FIG. 1 is modified, one select gate transistor is provided on the bit line side, and one select gate transistor is provided also on the source lined side;

FIG. 45 is a sectional diagram of a memory cell transistor portion of a related nonvolatile semiconductor memory in which NAND-type memory cell units are formed on both side wall portions of its trench region.

DESCRIPTION OF THE PREFERRED EMBODIMENTS

FIG. 1 is a diagram showing an equivalent circuit of a vertical NAND-type EEPROM cell array according to an embodiment of the present invention. First, the interconnection of a memory cell array of a nonvolatile semiconductor memory according to this embodiment will be explained based on FIG. 1.

As shown in FIG. 1, two NAND-type memory cell units ND1 and ND2 are provided for one bit line BL in the nonvolatile semiconductor memory according to this embodiment. The NAND-type memory cell unit ND1 is structured by connecting select gate transistors ST1 and ST3, 16 memory cell transistors MT, and a select gate transistor ST5 in series. Similarly, the NAND-type memory cell unit ND2 is structured by connecting select gate transistors ST2 and ST4, 16 memory cell transistors MT, and a select gate transistor ST6 in series.

The drain sides of the select gate transistors ST1 and ST2 are jointly connected to the bit line BL. The select gate transistors ST1 and ST4 are depletion-type (normally-on type) MOS transistors, and the other select gate transistors ST2, ST3, ST5, and ST6 are enhancement-type (normally-off type) MOS transistors. The source sides of the select gate transistors ST5 and ST6 are connected to a common source line SL.

Gate electrodes of the select gate transistors ST1 and ST2 of the NAND-type memory cell units ND1 and ND2 are jointly connected to constitute a select gate line SSL1. Gate electrodes of the select gate transistors ST3 and ST4 of the NAND-type memory cell units ND1 and ND2 are jointly connected to constitute a select gate line SSL2. Control gates of the 16 memory cell transistors MT of the NAND-type memory cell units ND1 and ND2 are jointly connected respectively to constitute word lines WL0 to WL15. Gate electrodes of the select gate transistors ST5 and ST6 of the NAND-type memory cell units ND1 and ND2 are jointly connected to constitute a select gate line GSL.

A bit line side switching portion in this embodiment is composed of the select gate transistors ST1, ST2, ST3, and ST4, whereby either one NAND-type memory cell unit is selected out of a pair of NAND-type memory cell units ND1 and ND2. Moreover, a source line side switching portion in this embodiment is composed of the select gate transistors ST5 and ST6.

In this embodiment, a plurality of such NAND-type memory cell units ND1 and DN2 as shown in FIG. 1 are arranged in an array form to compose one memory cell array.

Next, the structure of the NAND-type EEPROM cell array according to this embodiment will be explained based on FIG. 2 to FIG. 6.

Figure 2:
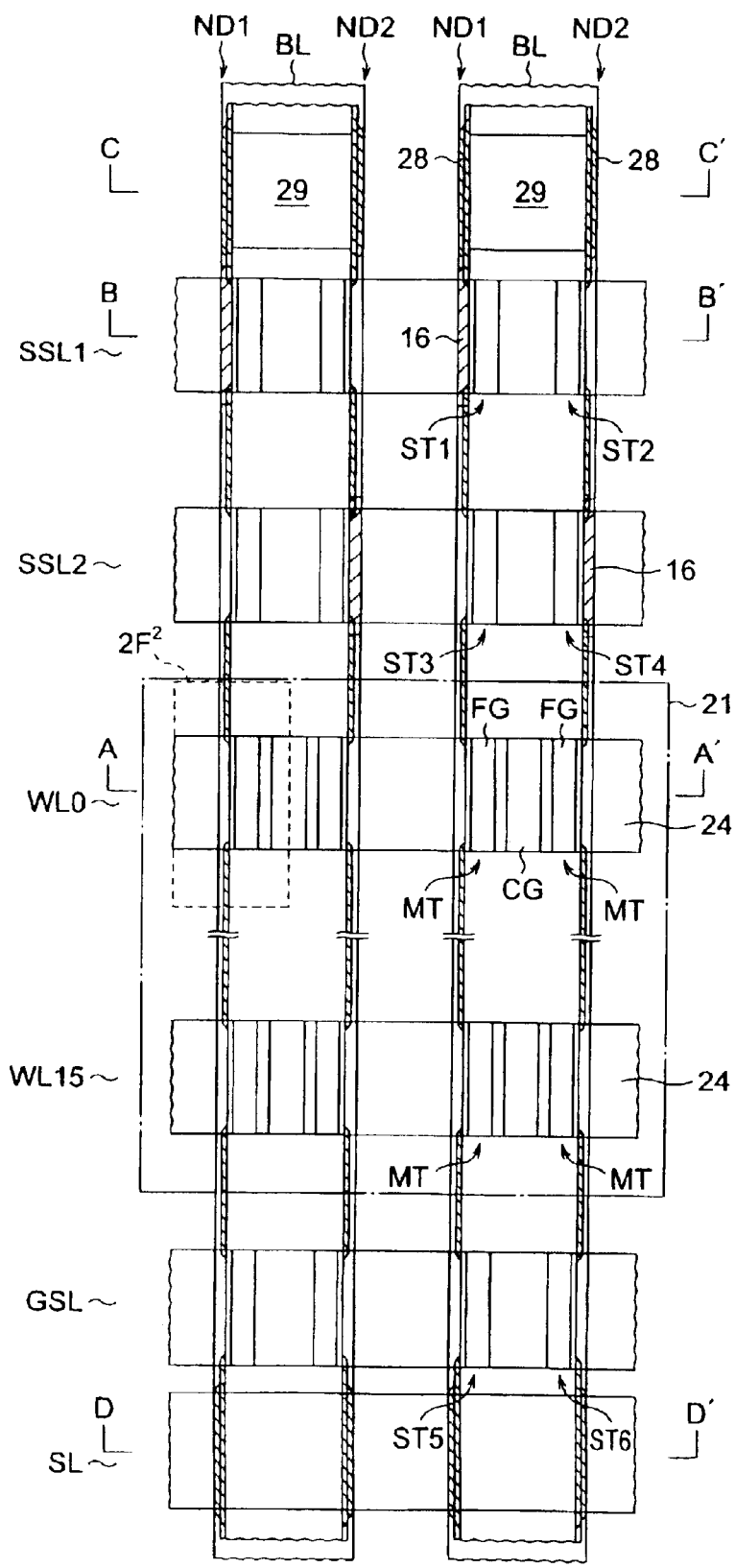
FIG. 2 is a diagram showing the structure of the NAND-type memory cell unit in plan view.
Figure 3A:
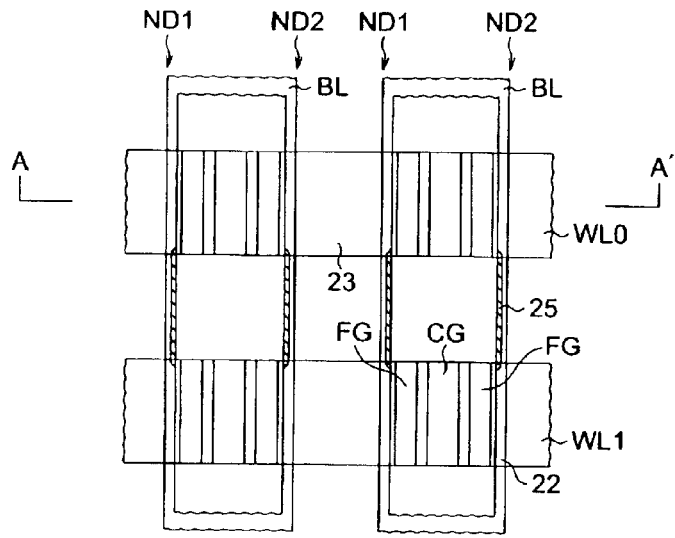
FIG. 3A is a schematic diagram showing the structure of a memory cell transistor portion in FIG. 2 in plan view.
Figure 3B:
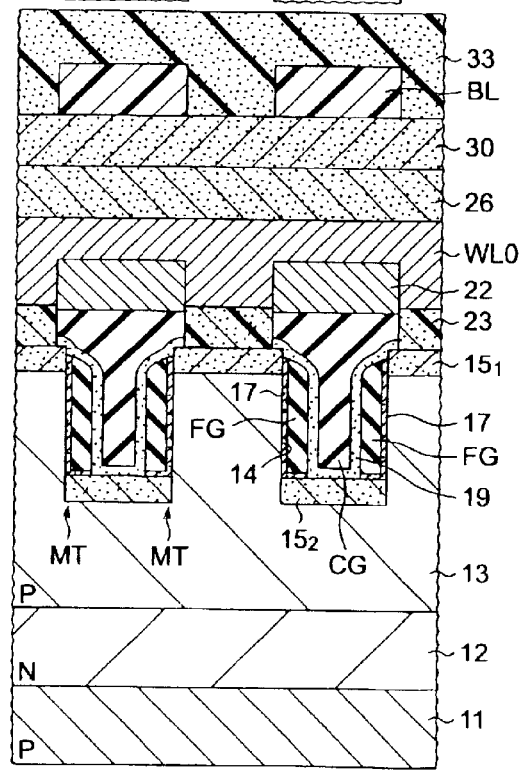
FIG. 3B is a diagram showing a cross section thereof taken along the line A–A'.
Figure 4A:
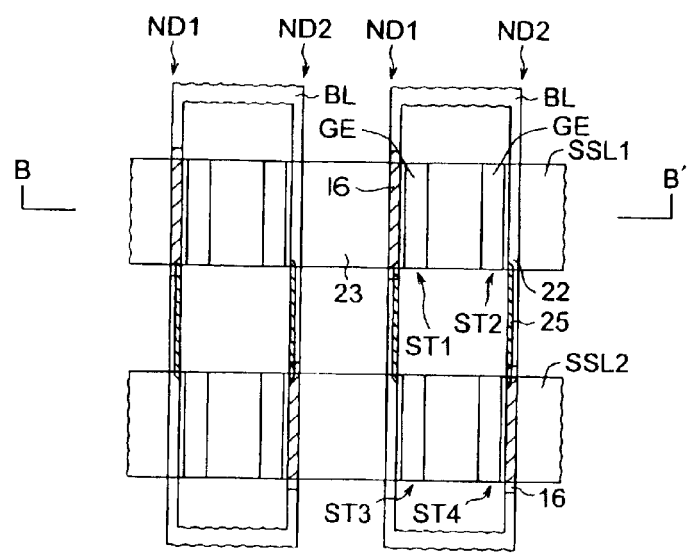
FIG. 4A is a schematic diagram showing the structure of a select gate transistor portion in FIG. 2 in plan view.
Figure 4B:
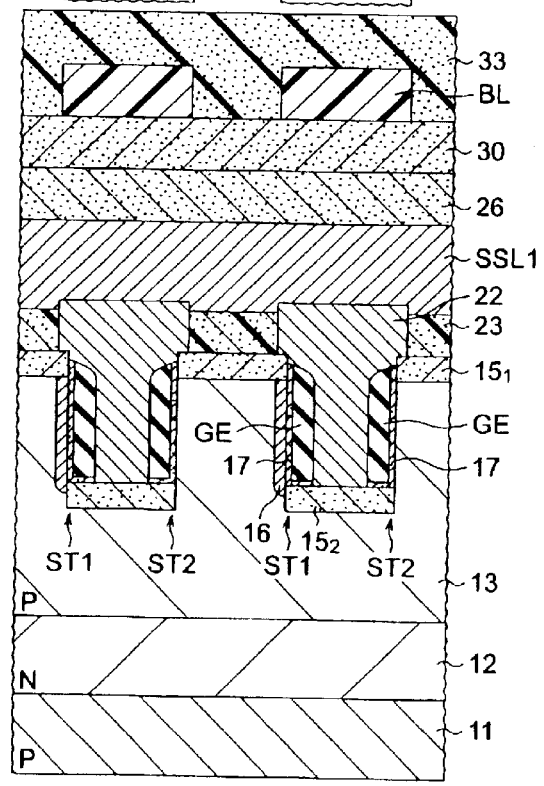
FIG. 4B is a diagram showing a cross section thereof taken along the line B–B'.
Figure 5A:
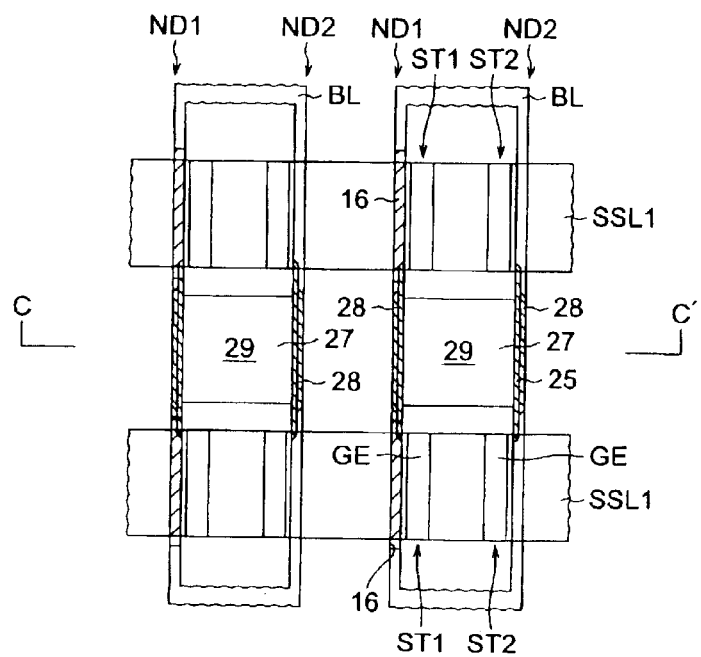
FIG. 5A is a schematic diagram showing the structure of a bit line contact portion in FIG. 2 in plan view.
Figure 5B:
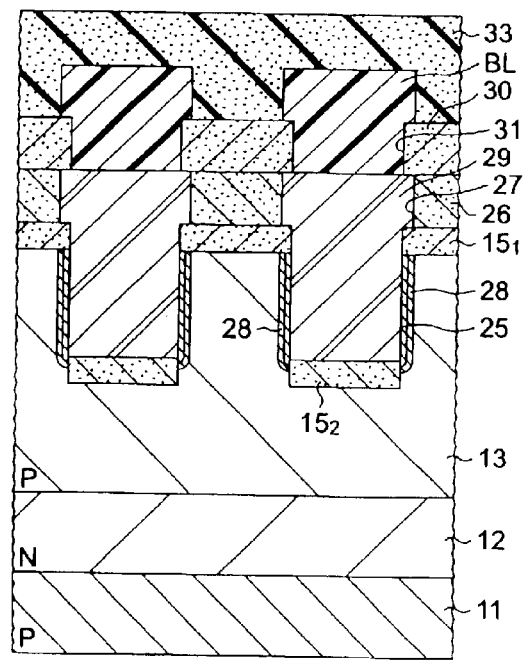
FIG. 5B is a diagram showing a cross section thereof taken along the line C–C'.
Figure 6A:
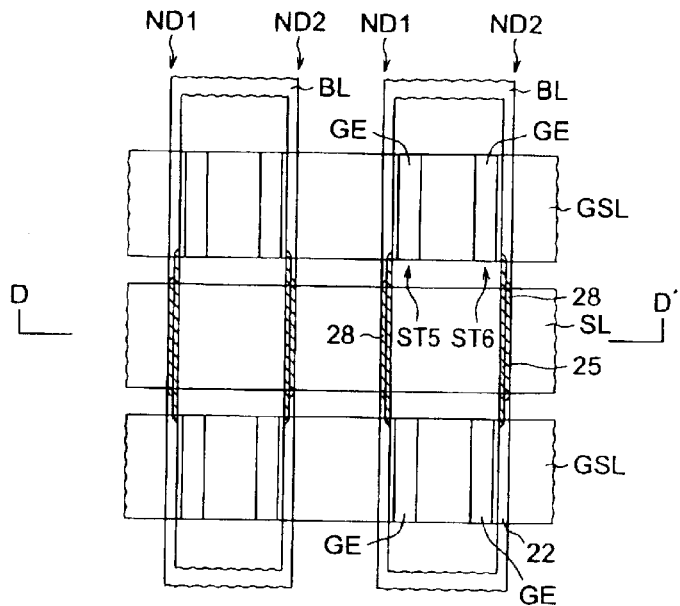
FIG. 6A is a schematic diagram showing the structure of a source line contact portion in FIG. 2 in plan view.
Figure 6B:
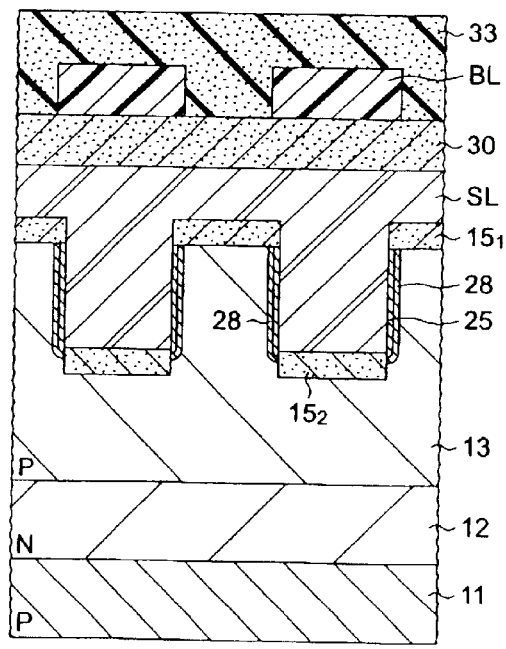
FIG. 6B is a diagram showing a cross section thereof taken along the line D–D'.
Figure 7A:
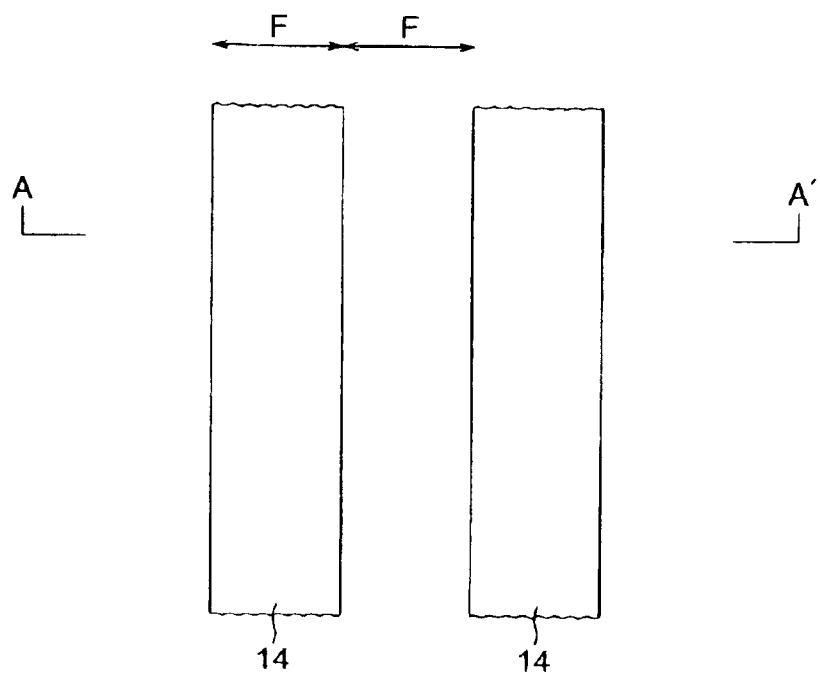
FIG. 7A is a schematic diagram showing a state of a manufacturing process of the memory cell transistor portion in FIG. 2 in plan view.
Figure 7B:
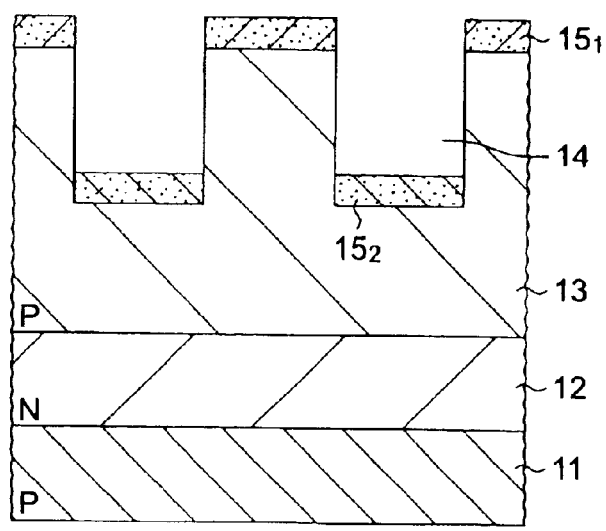
FIG. 7B is a diagram showing a cross section thereof taken along the line A–A' (First state)

FIG. 2 is a diagram schematically showing the NAND-type EEPROM cell array according to this embodiment in plan view, FIG. 3A is a diagram showing a word line portion in FIG. 2, and FIG. 3B is a diagram showing a cross section thereof taken along the line A–A'. FIG. 4A is a diagram schematically showing a selected word line portion in FIG. 2 in plan view, and FIG. 4B is a diagram showing a cross section thereof taken along the line B–B'. FIG. 5A is a diagram schematically showing a bit line contact portion in FIG. 2 in plan view, and FIG. 5B is a diagram showing a cross section thereof taken along the line C–C'. FIG. 6A is a diagram schematically showing a source line contact portion in FIG. 2 in plan view, and FIG. 6B is a diagram showing a cross section thereof taken along the line D–D'.

As shown in FIG. 2 to FIG. 6, on both side walls of one trench region 14, the NAND-type memory cell units ND1 and ND2 are formed respectively. Especially as shown in FIG. 2 and FIG. 3, the memory cell transistor MT of the NAND-type memory cell unit ND1 and the memory cell transistor MT of the NAND-type memory cell unit ND2 are formed so as to face each other in the one trench region 14.

More specifically, each of the two memory cell transistors MT and MT formed to face each other includes a thin oxide film 17 formed on a side wall, a floating gate FG, and an inter-poly insulating film 19. This inter-poly insulating film 19 is formed out of an ONO film, for example, in this embodiment. Further, these two memory cell transistors MT and MT formed to face each other include one common control gate CG. Furthermore, in place of the floating gate FG, a nitride film or the like film which traps a charge is also available.

This control gate CG is formed to extend substantially perpendicularly to the depth direction of the trench region 14, and connected to a polysilicon 22. This polysilicon 22 is formed to extend in the horizontal direction of the trench region 14, and connected to the continuously formed word lines WL0 to WL15 (the word line WL0 in FIG. 3). Incidentally, the control gate CG and the word lines WL0 to WL15 (the word line WL0 in FIG. 3) may be electrically connected directly without this polysilicon 22 therebetween.

Moreover, especially as shown in FIG. 2 and FIG. 4, the select gate transistor ST1 of the NAND-type memory cell unit ND1 and the select gate transistor ST2 of the NAND-type memory cell unit ND2 are formed so as to face each other in one trench region 14.

More specifically, the two select gate transistors ST1 and ST2 formed to face each other each include the thin oxide film 17 formed on the side wall, and a gate electrode GE. The select gate transistor ST1 is, however, a depletion-type MOS transistor, and thus an N-type impurity region 16 is formed in a memory cell P-type well 13 in a side wall portion of the trench region 14, that is, in a portion composing a channel. Such two select gate transistors ST1 and ST2 formed to face each other are connected to the common polysilicon 22.

This polysilicon 22 is formed to extend substantially perpendicularly to the depth direction of the trench region 14, and connected to the continuously formed select gate line SSL1.

Especially as shown in FIG. 2 and FIG. 5, these select gate transistors ST1 and ST2 are each connected to one plug-shaped metal layer 29 via a contact region 28, and this plug-shaped metal layer 29 is connected to the bit line BL.

Likewise with these select gate transistors ST1 and ST2, as shown in FIG. 2, the select gate transistor ST3 of the NAND-type memory cell unit ND1 and the select gate transistor ST4 of the NAND-type memory cell unit ND2 are formed so as to face each other in one trench region 14. As for these select gate transistors ST3 and ST4, the select gate transistor ST4 is a depletion-type MOS transistor, and hence the N-type impurity region 16 is formed in a portion composing a channel. Except for this point, the structures of the select gate transistors ST3 and ST4 are the same as those of the aforesaid select gate transistors ST3 and ST4.

Similarly to these select gate transistors ST1, ST2, ST3, and ST4, as shown in FIG. 2, the select gate transistor ST5 of the NAND-type memory cell unit ND1 and the select gate transistor ST6 of the NAND-type memory cell unit ND2 are formed so as to face each other in one trench region 14. The structures of these select gate transistors ST5 and ST6 are the same as those of the aforesaid enhancement-type select gate transistors ST2 and ST3.

Especially, as shown in FIG. 2 and FIG. 6, these select gate transistors ST5 and ST6 are each connected to the continuously formed common source line SL via the contact region 28.

Next, a method of manufacturing the nonvolatile semiconductor memory according to this embodiment will be explained based on FIG. 7 to FIG. 34.

Out of these Figures, FIG. 7 to FIG. 10, FIG. 11 to FIG. 14, FIG. 15 to FIG. 18, FIG. 19 to FIG. 22, FIG. 23 to FIG. 26, FIG. 27 to FIG. 30, and FIG. 31 to FIG. 34 are diagrams each for explaining a state of a manufacturing process of the nonvolatile semiconductor memory divided into four sections. The diagrams showing these four sections correspond to the aforesaid FIG. 3 to FIG. 6, respectively.

First, as shown in FIG. 7 to FIG. 10, a memory cell N-type well 12 is formed on a semiconductor substrate 11 which is a P-type silicon substrate. Then, the memory cell P-type well 13 is formed in the memory cell N-type well 12. An oxide film 151 is formed on the surface of the memory cell P-type well 13. This oxide film 151 is formed, for example, by CVD (Chemical Vapor Deposition). Thereafter, the trench region 14 is formed in the memory cell P-type well 13. This trench region 14 is formed, for example, by patterning a photoresist and performing RIE (Reactive Ion Etching). Hence, the width of the trench region 14 is 1 F, and the distance between the trench regions 14 is also 1 F.

Subsequently, an oxide film 152 is deposited at the bottom of the trench region 14. Namely, after an oxide film is deposited by the CVC while the photoresist remains, the photoresist is removed, thereby forming the oxide film 152 at the bottom of the trench region 14. The oxide film 151 and the oxide film 152, however, may be formed in the same process. In this case, it is recommended that the aforesaid process of forming the oxide film 151 be omitted, and that by depositing an oxide film by the CVD after the photoresist which has been used for forming the trench region 14 is removed, the oxide film $15_1$ and the oxide film $15_2$ be formed at the same time.

Figure 8A:
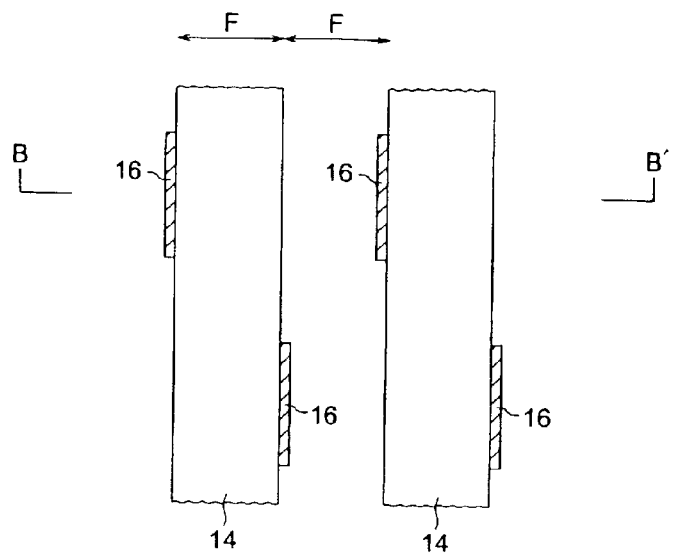
FIG. 8A is a schematic diagram showing a state of a manufacturing process of the select gate transistor portion in FIG. 2 in plan view.
Figure 8B:
FIG. 8B is a diagram showing a cross section thereof taken along the line B–B' (First state)
Figure 8B:
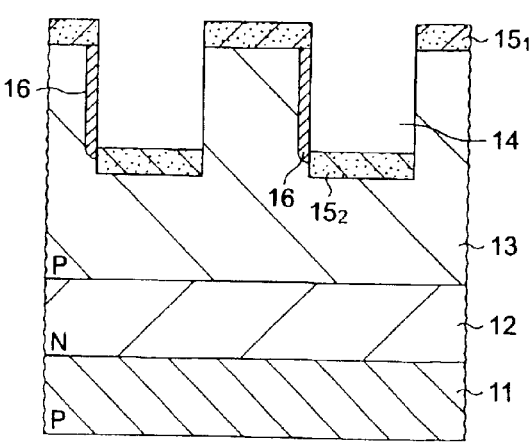
Figure 9A:
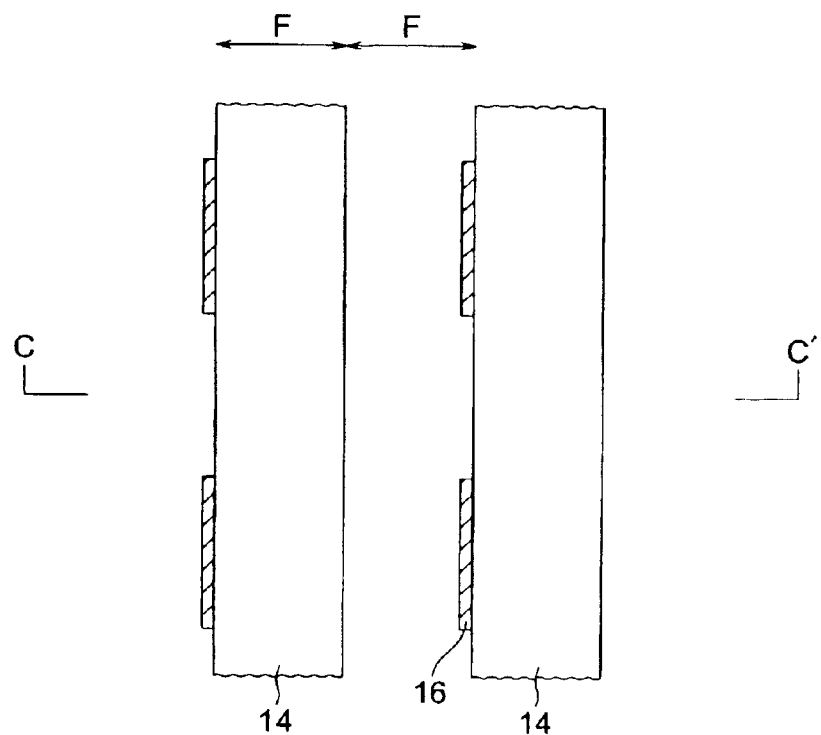
FIG. 9A is a schematic diagram showing a state of a manufacturing process of the bit line contact portion in FIG. 2 in plan view.
Figure 9B:
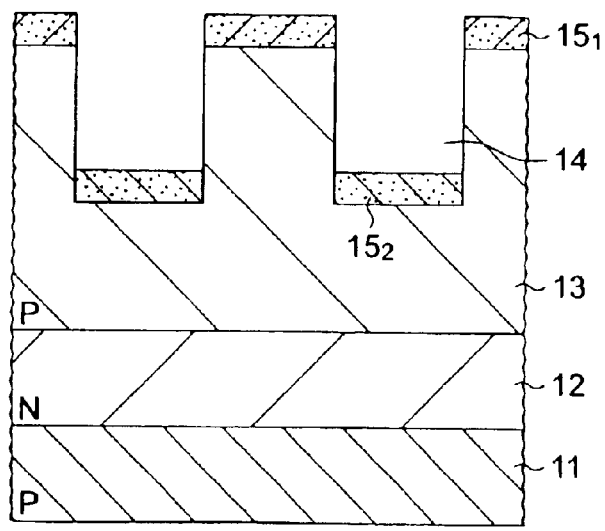
FIG. 9B is a diagram showing a cross section thereof taken along the line C–C' (First state)
Figure 11A:
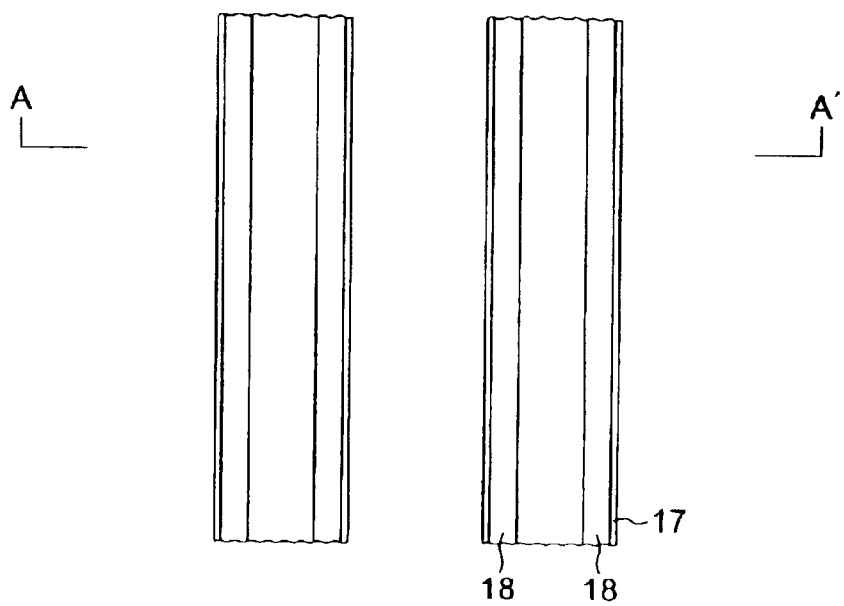
FIG. 11A is a schematic diagram showing a state of the manufacturing process of the memory cell transistor portion in FIG. 2 in plan view.
Figure 11B:
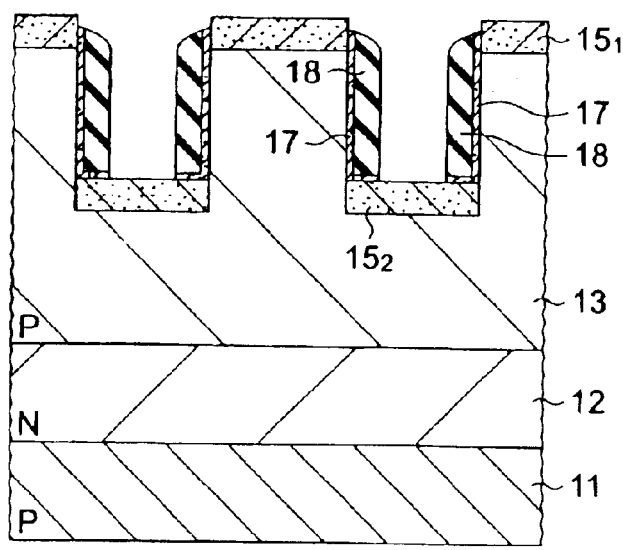
FIG. 11B is a diagram showing a cross section thereof taken along the line A–A' (Second state)
Figure 12A:
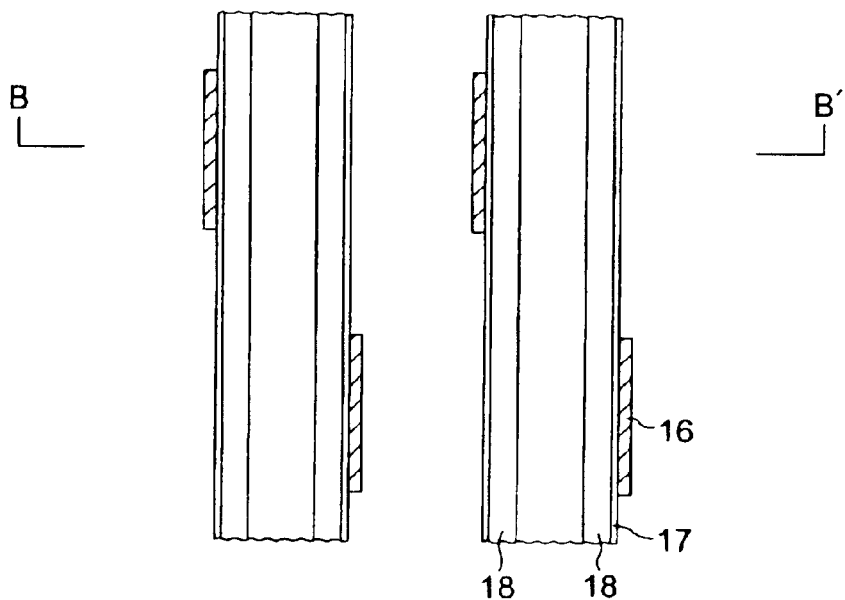
FIG. 12A is a schematic diagram showing a state of the manufacturing process of the select gate transistor portion in FIG. 2 in plan view.
Figure 12B:
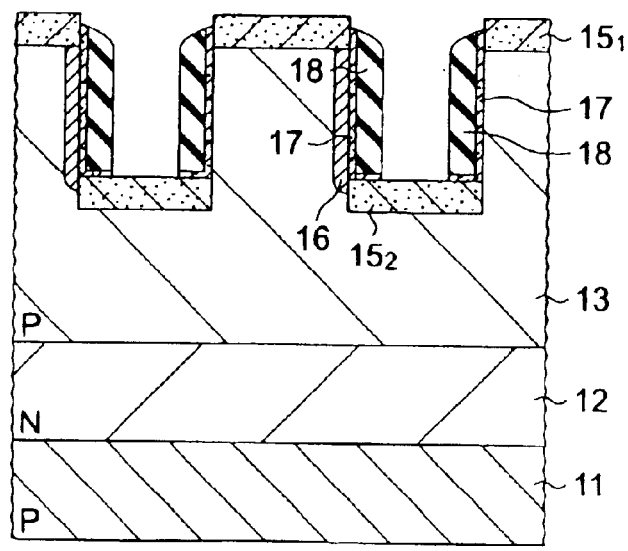
FIG. 12B is a diagram showing a cross section thereof taken along the line B–B' (Second state)
Figure 13A:
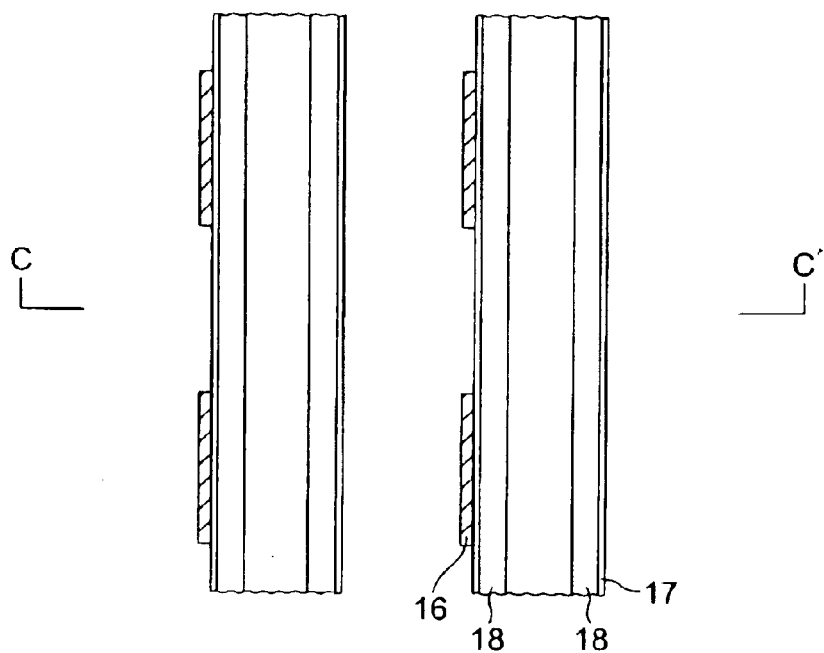
FIG. 13A is a schematic diagram showing a state of the manufacturing process of the bit line contact portion in FIG. 2 in plan view.
Figure 13B:
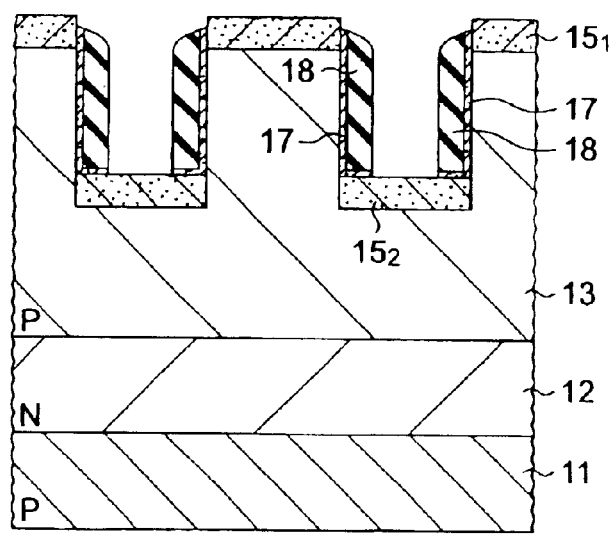
FIG. 13B is a diagram showing a cross section thereof taken along the line C–C' (Second state)
Figure 18A:
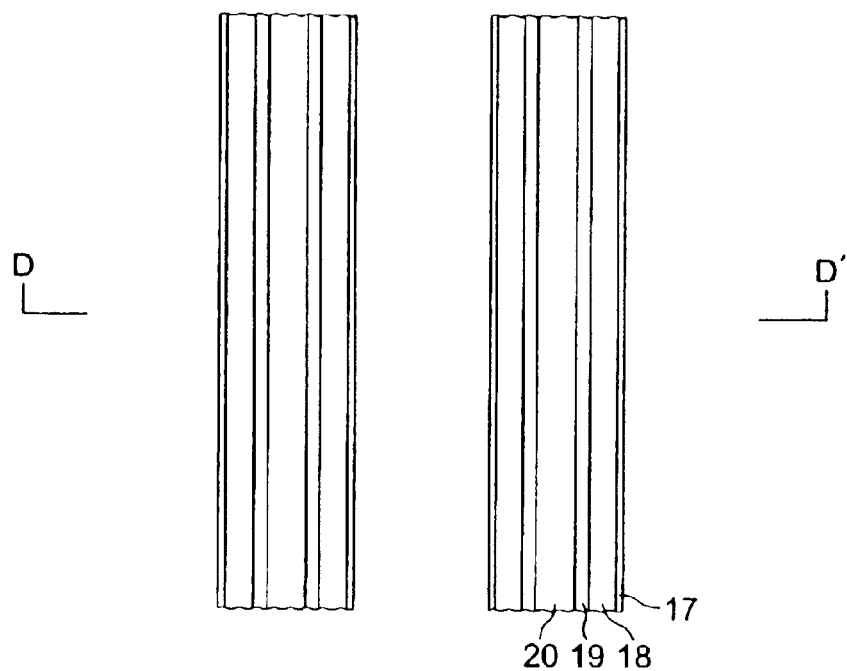
FIG. 18A is a schematic diagram showing a state of the manufacturing process of the source line contact portion in FIG. 2 in plan view.
Figure 18B:
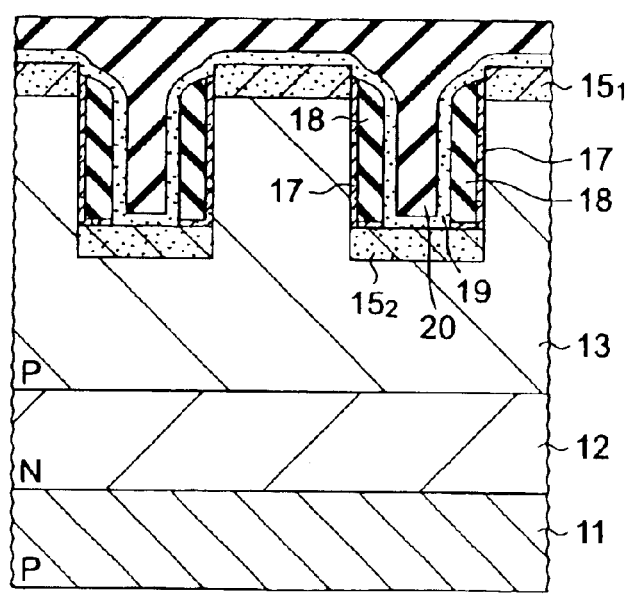
FIG. 18B is a diagram showing a cross section thereof taken along the line D–D' (Third state)
Figure 19A:
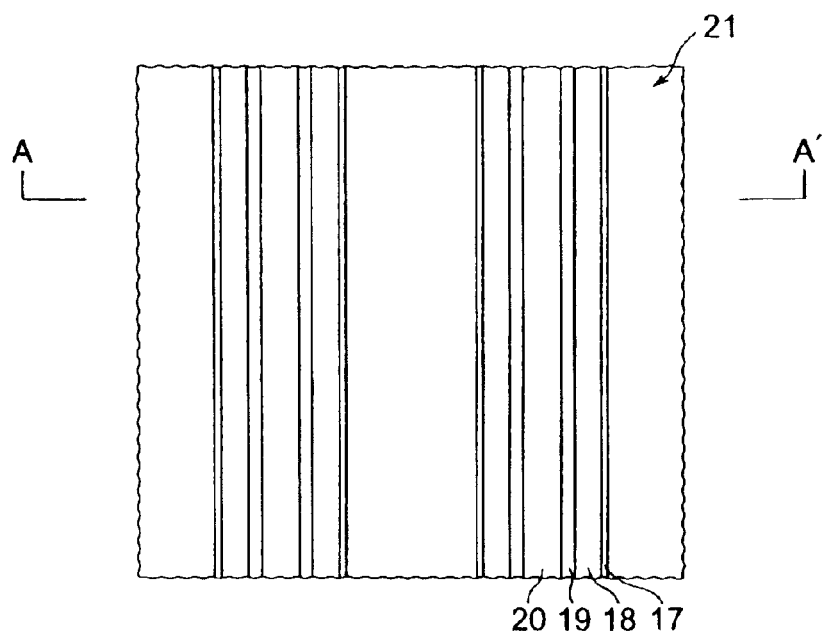
FIG. 19A is a schematic diagram showing a state of the manufacturing process of the memory cell transistor portion in FIG. 2 in plan view.
Figure 19B:
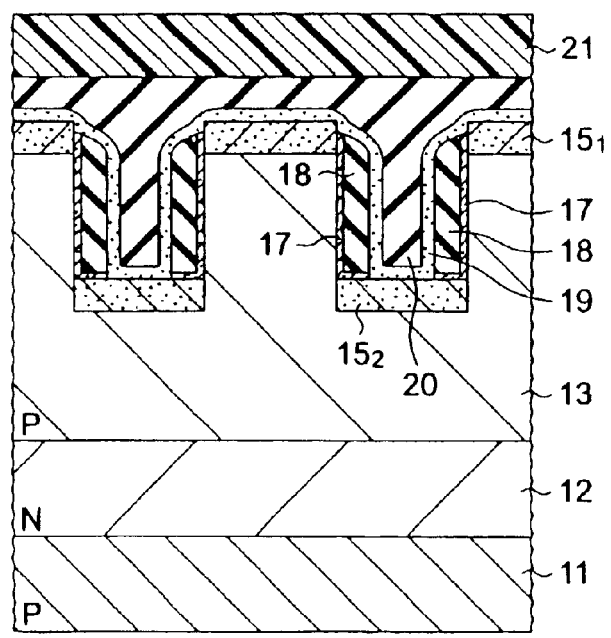
FIG. 19B is a diagram showing a cross section thereof taken along the line A–A' (Fourth state)
Figure 22A:
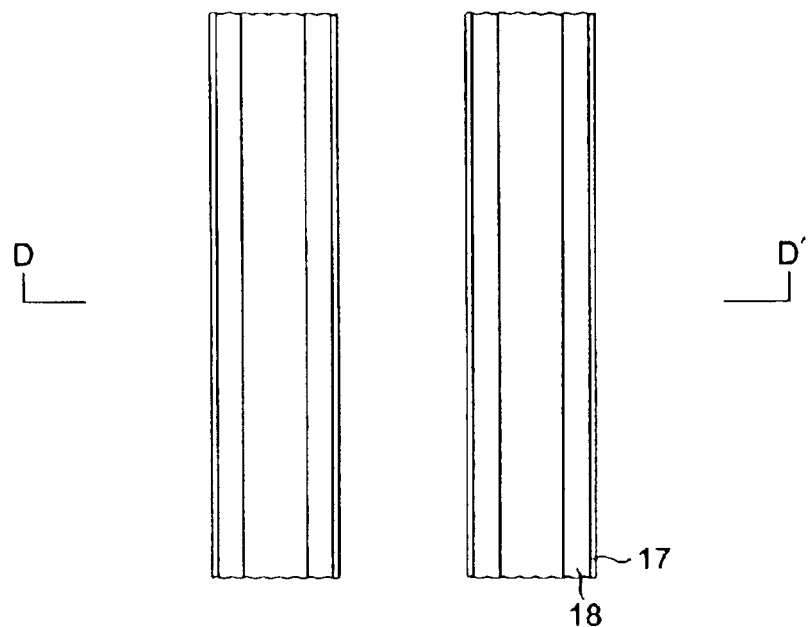
FIG. 22A is a schematic diagram showing a state of the manufacturing process of the source line contact portion in FIG. 2 in plan view.
Figure 22B:
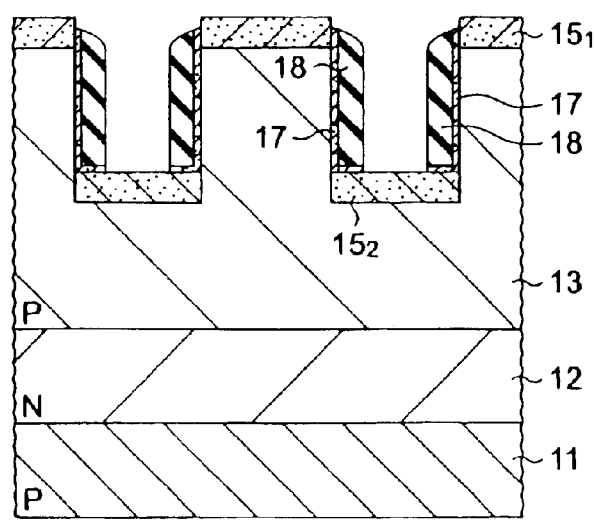
FIG. 22B is a diagram showing a cross section thereof taken along the line D–D' (Fourth state)

Then, especially as shown in FIG. 8, arsenic (As) and phosphorus (P) are selectively ion-implanted into gate regions of the select gate transistors ST1 and ST4 to form the N-type impurity regions 16. Specifically, the photoresist is applied over the entire surface before ion implantation, and photoresist openings are formed in the gate region portions of the select gate transistors ST1 and ST4. Subsequently, ion implantation is performed through the photo resist openings with an inclination of +7 degrees vertical to the semiconductor substrate 11, whereby the ion implantation can be selectively performed for only one side wall of the trench region 14. Similarly, by performing ion implantation through the photoresist openings with an inclination of −7 degrees vertical to the semiconductor substrate 11, the ion implantation can be selectively performed for only the other side wall of the trench region 14. The aforesaid formation of the N-type impurity regions 16 can make threshold voltages of the select gate transistors ST1 and ST4 negative and depletion mode.

Thereafter, as shown in FIG. 11 to FIG. 14, the thin oxide film 17 is formed on each of side walls of the trench region 14. This thin oxide film 17 is formed, for example, by the CVD. Therefore, the oxide film formed by the CVD is also formed on the oxide film $15_1$ and the oxide film $15_2$, but the illustration thereof is omitted since it is thin.

Subsequently, a polysilicon 18 to which impurities are doped is deposited on each of side wall portions of the trench region 14. Specifically, after being deposited overall on the bottom, the side walls, and the top of the trench region 14 by the CVD, the polysilicon is etched overall by RIE. Thus, the polysilicon deposited on the side wall portion of the trench region 14 remains, resulting in the formation of the polysilicon 18. Namely, this polysilicon 18 is formed by a self-aligned side wall leaving technology. The polysilicon 18 left at the side wall portion constitutes the floating gate FG or the gate electrode GE later.

Then, as shown in FIG. 15 to FIG. 18, the inter-poly insulating film 19 is deposited overall at the bottom, the side walls, and the top of the trench region 14. In this embodiment, this inter-poly insulating film 19 is formed out of an ONO (Oxide-Nitride-Oxide) film. For example, this ONO film is formed by forming a lower oxide film by thermal oxidation, forming a nitride film by LP-CVD (Low Pressure CVD), and then forming an upper oxide film by thermal oxidation. Subsequently, a polysilicon 20, to which impurities are doped, are deposited over the entire surface. In place of this polysilicon 20, however, a metal such as tungsten may be deposited. This polysilicon 20 constitutes the control gate CG later.

Thereafter, as shown in FIG. 19 to FIG. 22, only a memory cell transistor region is covered with a protective film 21. Namely, as shown in FIG. 2, after a protective film is formed overall, the protective film in the regions of the select gate transistors ST1 to ST6 is removed to form the protective film 21 in the memory cell transistor region. Then, with the protective film 21 as a mask, the inter-poly insulating film 19 and the polysilicon 20 formed in regions other than the memory cell transistor region are removed.

Figure 23A:
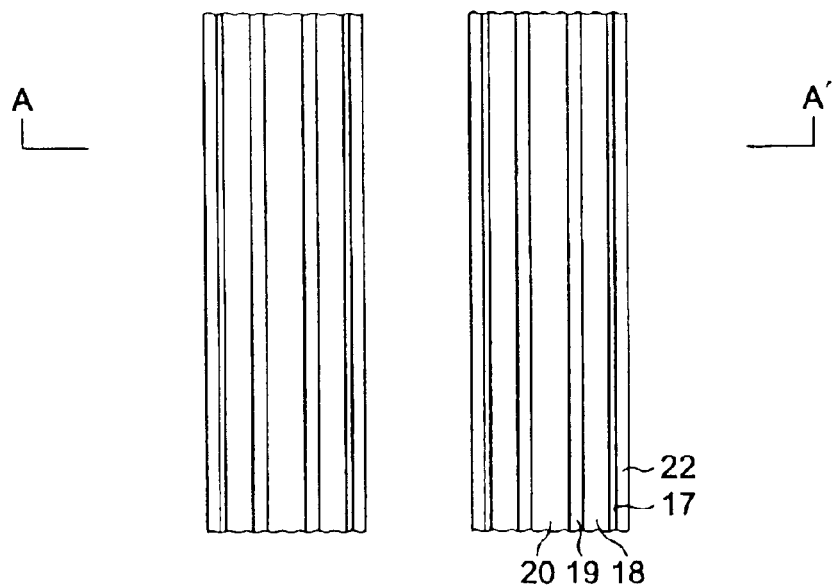
FIG. 23A is a schematic diagram showing a state of the manufacturing process of the memory cell transistor portion in FIG. 2 in plan view.
Figure 23B:
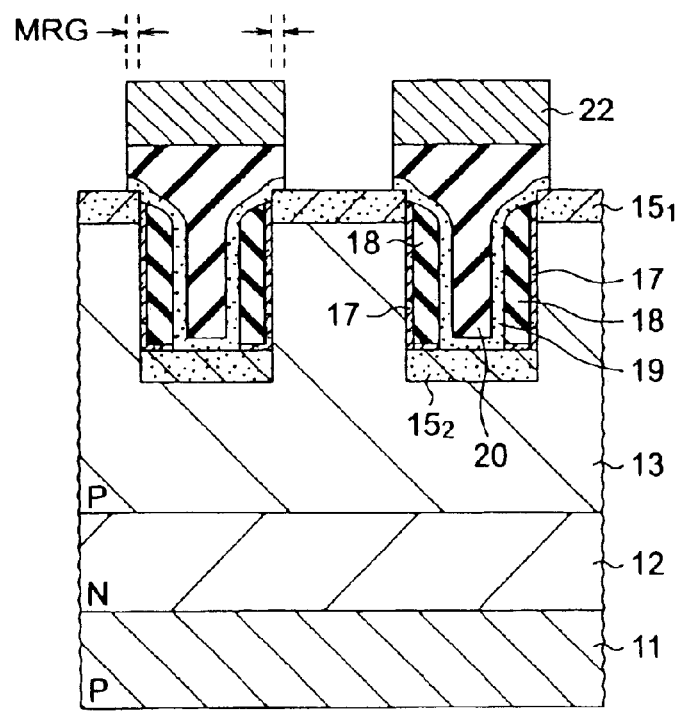
FIG. 23B is a diagram showing a cross section thereof taken along the line A–A' (Fifth state)
Figure 24A:
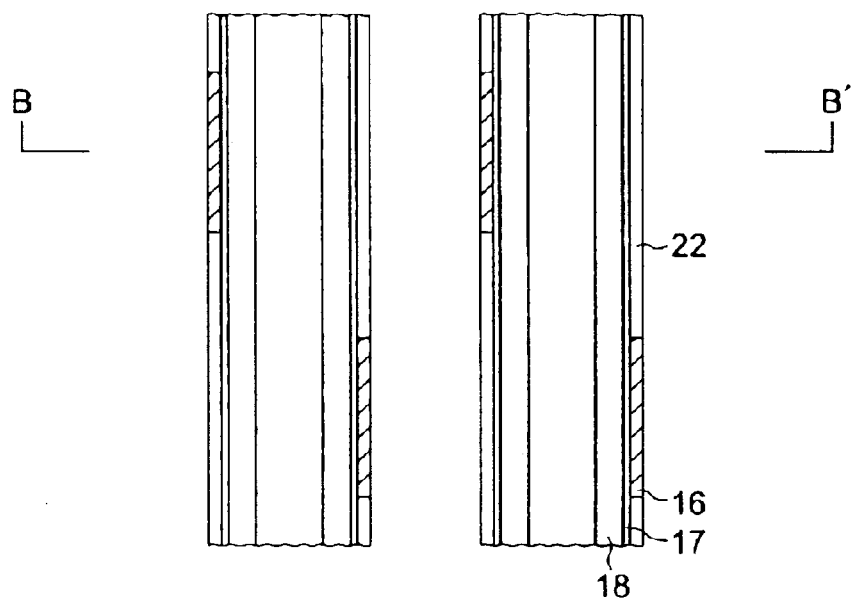
FIG. 24A is a schematic diagram showing a state of the manufacturing process of the select gate transistor portion in FIG. 2 in plan view.
Figure 24B:
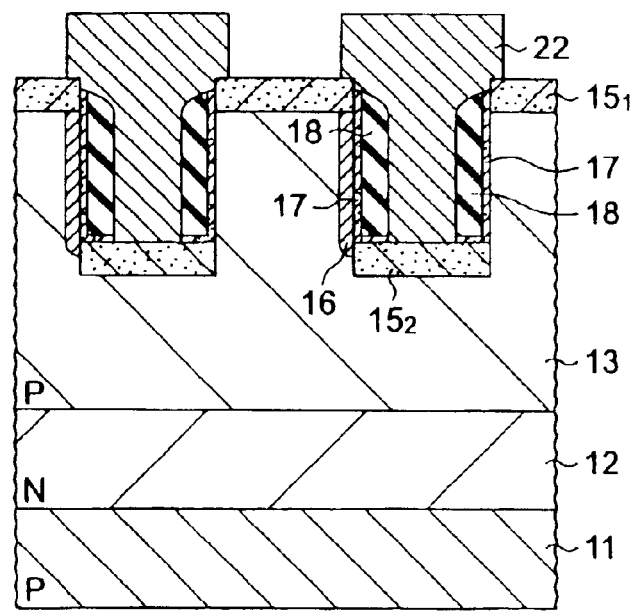
FIG. 24B is a diagram showing a cross section thereof taken along the line B–B' (Fifth state)
Figure 26A:
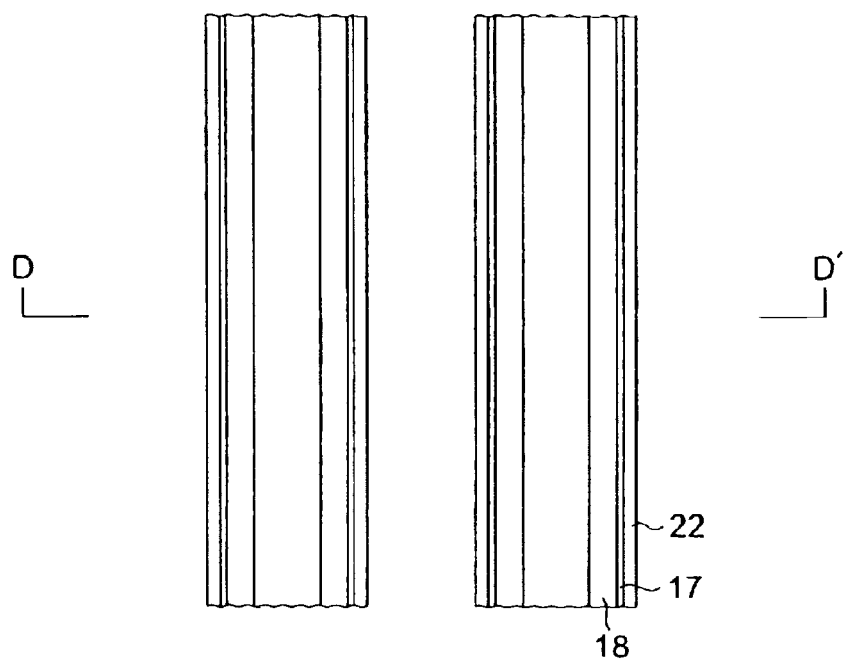
FIG. 26A is a schematic diagram showing a state of the manufacturing process of the source line contact portion in FIG. 2 in plan view.
Figure 26B:
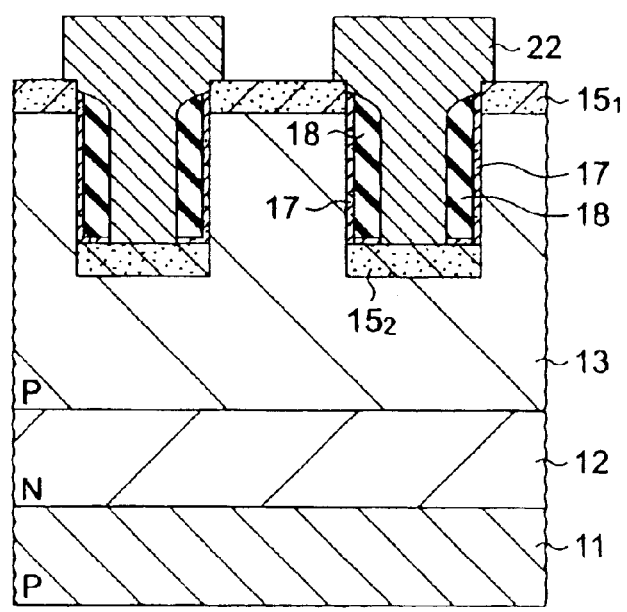
FIG. 26B is a diagram showing a cross section thereof taken along the line D–D' (Fifth state)

Then, as shown in FIG. 23 to FIG. 26, the protective film 21 is removed, and the polysilicon 22, to which impurities are doped, are deposited over the entire surface. Subsequently, the polysilicon 20 and the polysilicon 22 are patterned at the same time and separated in the direction of the bit line BL. On this occasion, in the memory cell transistor region, especially as shown in FIG. 23, the inter-poly insulating film 19 is also patterned simultaneously and separated in the direction of the bit line BL. Specifically, a photoresist having slits in the direction of the bit line BL is formed at the upper portion of the oxide film 151, and the RIE is performed with this photoresist as a mask. Thereby, in the memory cell transistor region, especially as shown in FIG. 23, the inter-poly insulating film 19, the polysilicon 20, and the polysilicon 22 are respectively separated in the direction of the bit line. As a result, in the memory cell transistor region, the polysilicon 22 is deposited directly on the polysilicon 20, and they have electrically the same node. Further, in the select gate transistor regions which are regions other than the memory cell transistor region, especially as shown in FIG. 24 to FIG. 26, the polysilicon 22 is separated in the direction of the bit line. As a result, in the regions other than the memory cell transistor region, the polysilicon 22 is deposited directly on the polysilicon 18 without the inter-poly insulating film 19 therebetween, and they have electrically the same node. Incidentally, in place of the polysilicon 22, a metal such as tungsten may be deposited.

This patterning, however, can be also performed self-aligningly. In this case, the oxide film $15_1$ is formed rather thickly and etched over the entire surface by the RIE. Thus, the inter-poly insulating film 19, the polysilicon 20, and the polysilicon 22 may be left self-aligningly for the trench region 14. In this case, one photoresist mask can be omitted, and a mask alignment tolerance MRG (See FIG. 23) becomes unnecessary.

As shown in FIG. 27 to FIG. 30, an interlayer dielectric 23 is formed overall so as to fill spaces between the polysilicons 22. Subsequently, by depositing and patterning a metal layer, the word lines WL0 to WL15 and the select gate lines SSL1, SSL2, and GSL are formed. Before this patterning, the metal layer may be flattened by CMP (Chemical Mechanical Polishing). Moreover, the metal layer may be tungsten silicide (WSi), aluminum (Al), or polysilicon (Poly-Si).

Figure 27A:
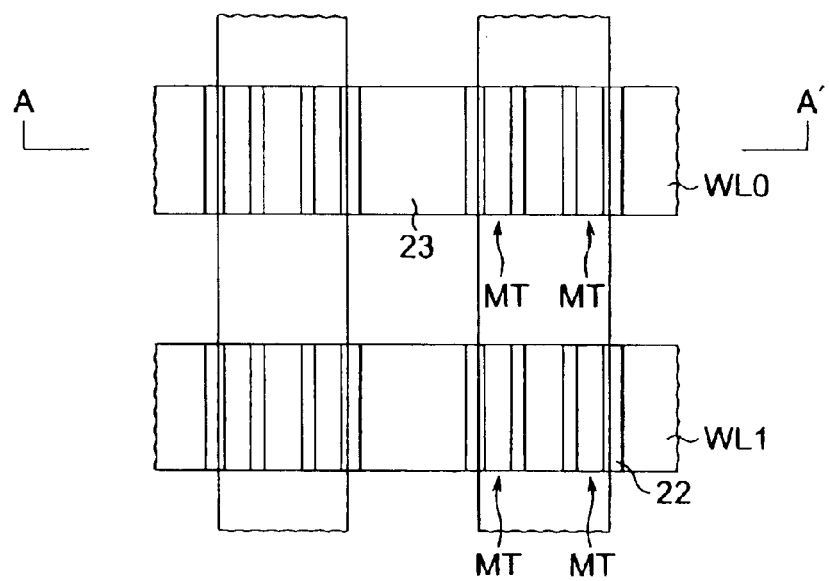
FIG. 27A is a schematic diagram showing a state of the manufacturing process of the memory cell transistor portion in FIG. 2 in plan view.
Figure 27B:
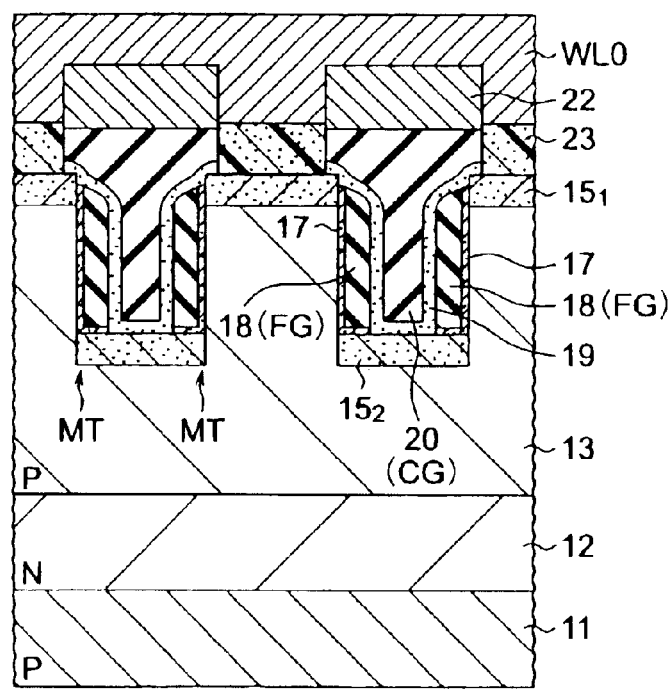
FIG. 27B is a diagram showing a cross section thereof taken along the line A–A' (Sixth state)
Figure 28A:
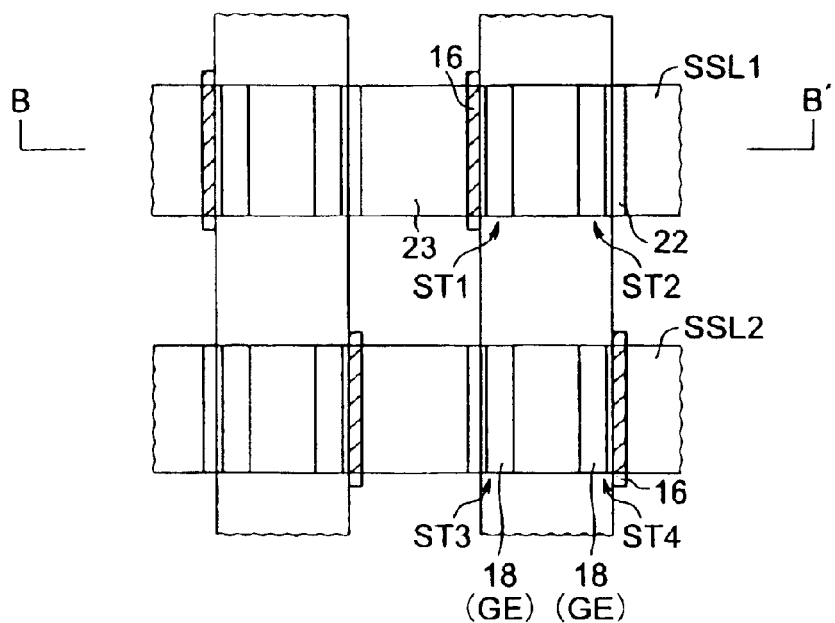
FIG. 28A is a schematic diagram showing a state of the manufacturing process of the select gate transistor portion in FIG. 2 in plan view.
Figure 28B:
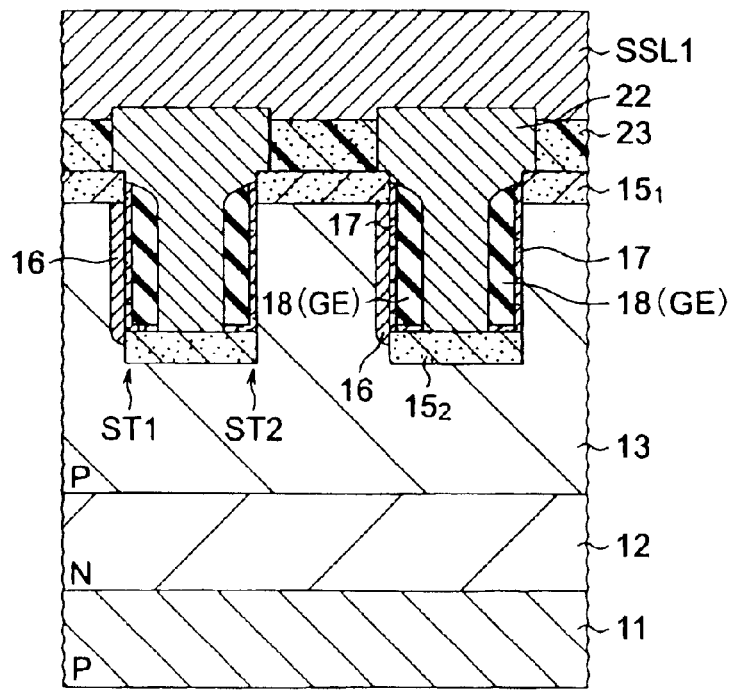
FIG. 28B is a diagram showing a cross section thereof taken along the line B–B' (Sixth state)
Figure 29A:
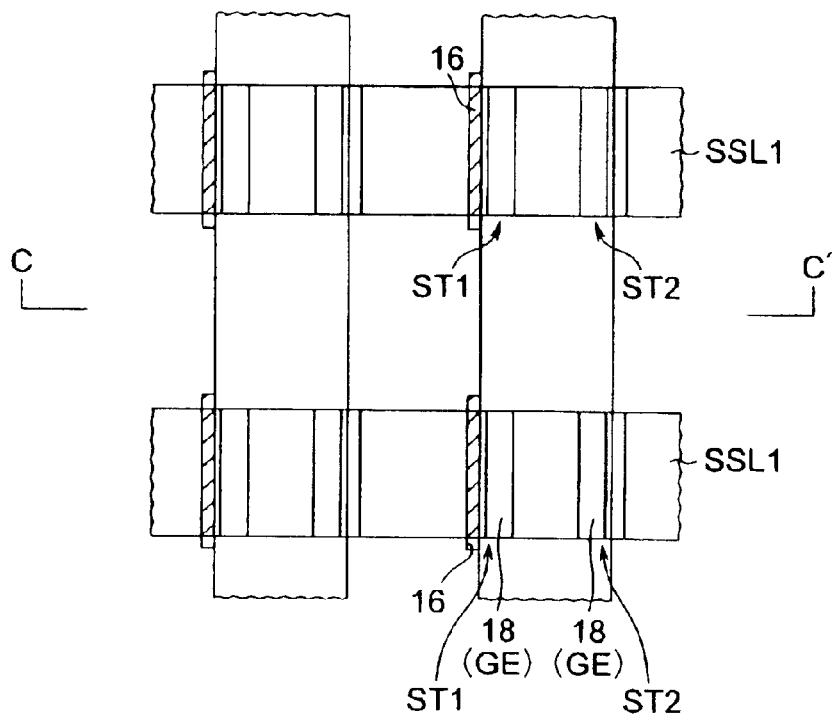
FIG. 29A is a schematic diagram showing a state of the manufacturing process of the bit line contact portion in FIG. 2 in plan view.
Figure 29B:
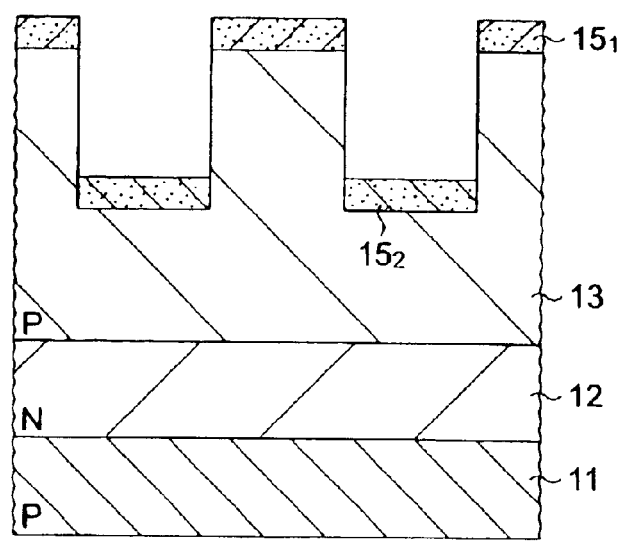
FIG. 29B is a diagram showing a cross section thereof taken along the line C–C' (Sixth state)
Figure 30A:
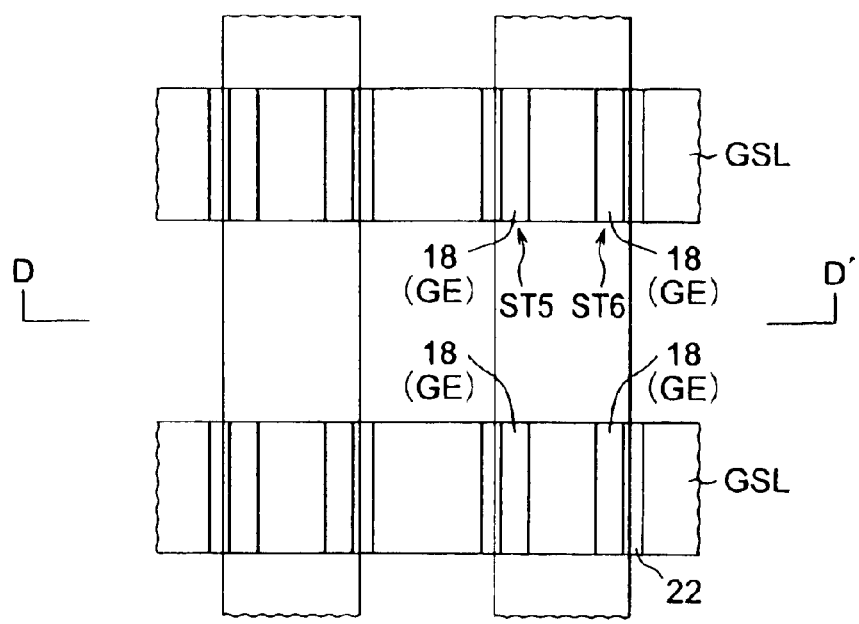
FIG. 30A is a schematic diagram showing a state of the manufacturing process of the source line contact portion in FIG. 2 in plan view.
Figure 30B:
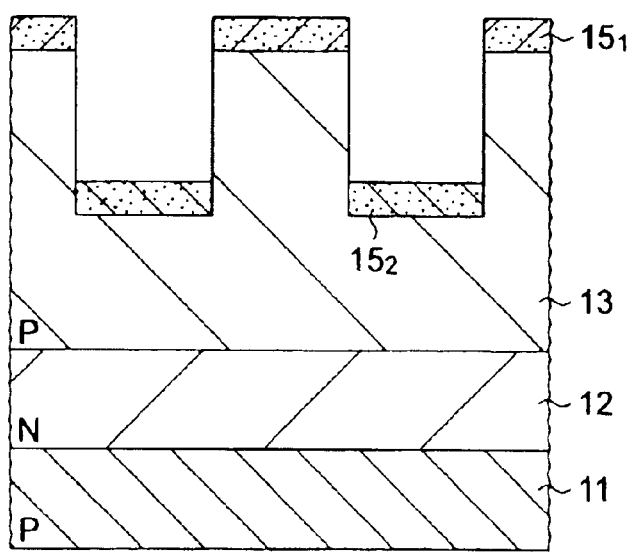
FIG. 30B is a diagram showing a cross section thereof taken along the line D–D' (Sixth state)
Figure 31A:
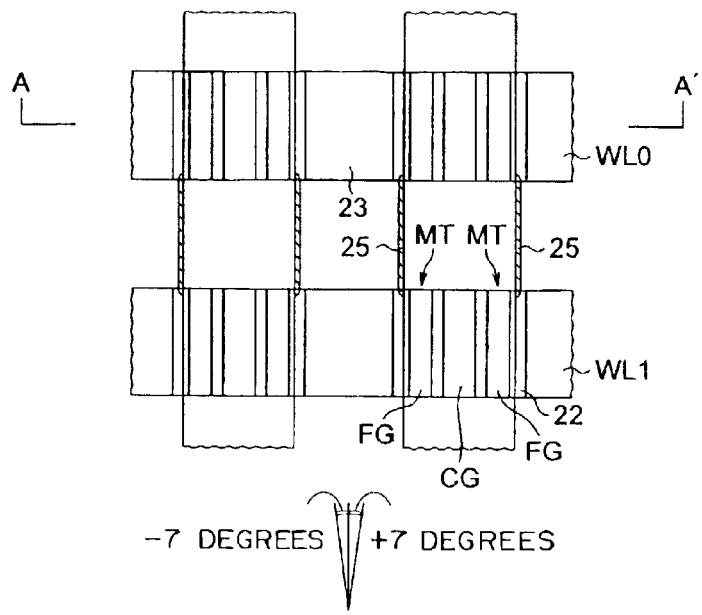
FIG. 31A is a schematic diagram showing a state of the manufacturing process of the memory cell transistor portion in FIG. 2 in plan view.
Figure 31B:
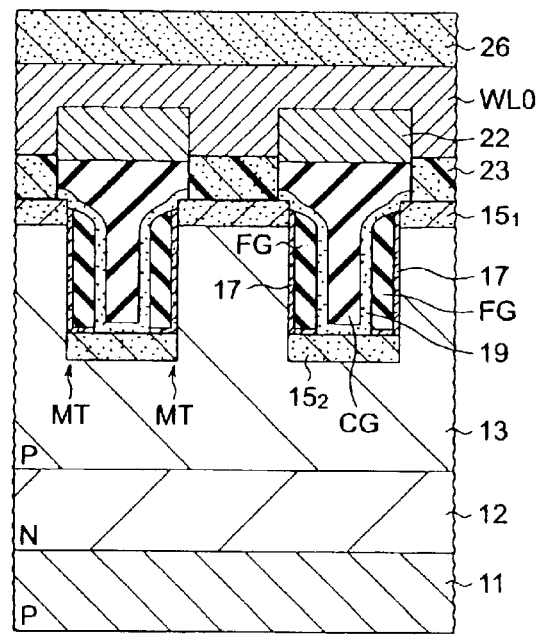
FIG. 31B is a diagram showing a cross section thereof taken along the line A–A' (Seventh state)
Figure 32A:
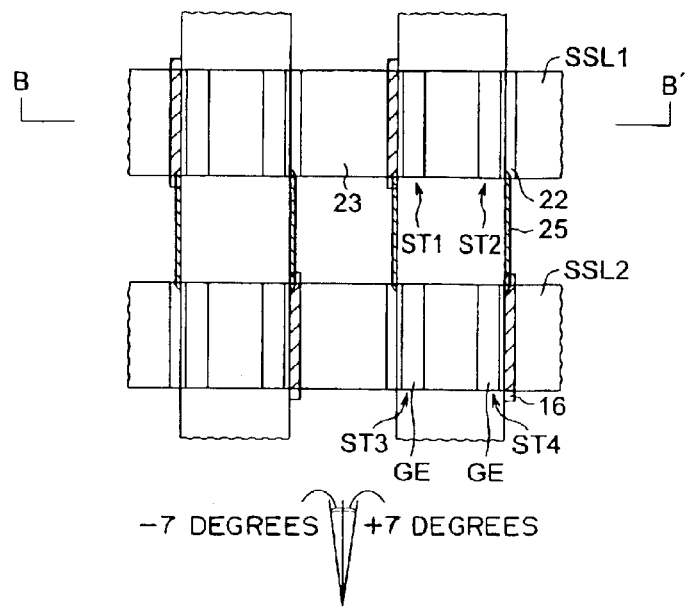
FIG. 32A is a schematic diagram showing a state of the manufacturing process of the select gate transistor portion in FIG. 2 in plan view.
Figure 32B:
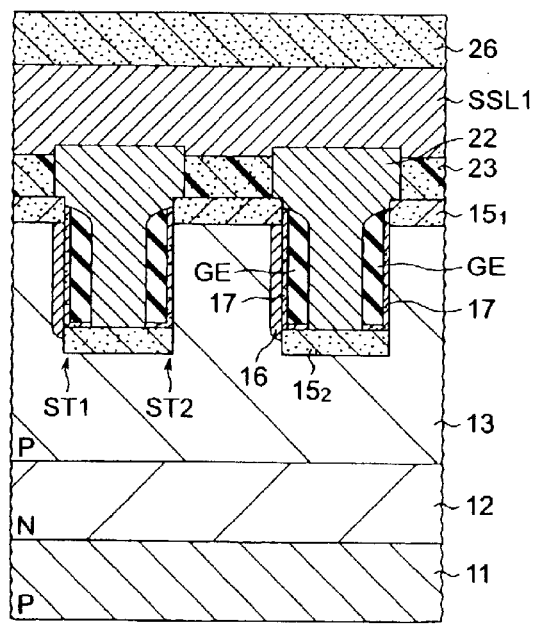
FIG. 32B is a diagram showing a cross section thereof taken along the line B–B' (Seventh state)
Figure 33A:
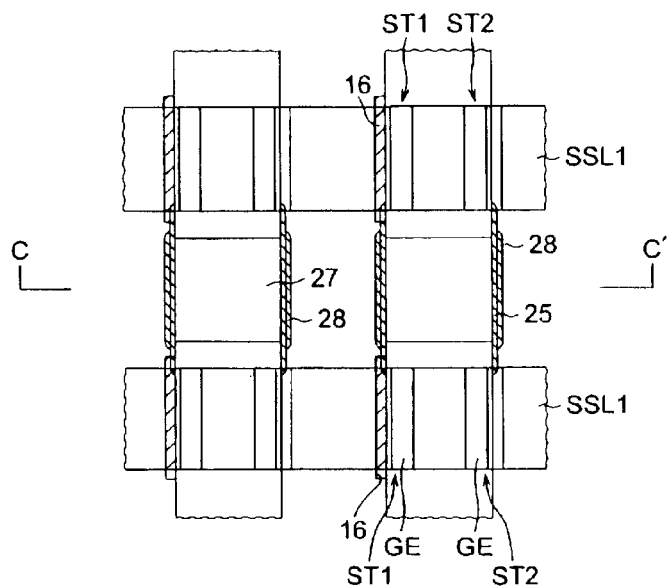
FIG. 33A is a schematic diagram showing a state of the manufacturing process of the bit line contact portion in FIG. 2 in plan view.
Figure 33B:
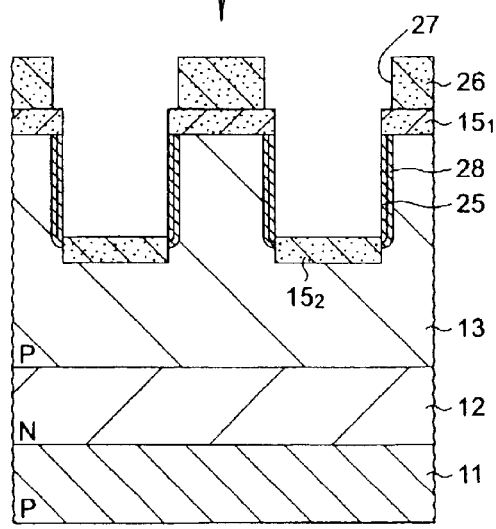
FIG. 33B is a diagram showing a cross section thereof taken along the line C–C' (Seventh state)

Specifically, when the metal layer is patterned, a photoresist having slits in the directions of word lines WL0 to WL15 is formed. By etching the metal layer by the RIE with this photoresist as a mask, the word lines WL0 to WL15 and the select gate lines SSL1, SSL2, and GSL are formed. Further, with this photoresist as a mask, the interlayer dielectric 23, the polyhsilicon 22, the polysilicon 20, the inter-poly insulating film 19, the polysilicon 18, and the thin oxide film 17 are sequentially etched by the RIE. As a result, these films are separated in the directions of the word lines WL0 to WL15, and particularly as shown in FIG. 27, the polysilicon 18 constitutes the floating gate FG of the memory cell transistor MT, and the plysilicon 20 constitutes the control gate CG of the memory cell transistor MT. Especially as shown in FIG. 28 to FIG. 30, the polysilicon 18 constitutes the gate electrode GE of each of the select gate transistors ST1 to ST6.

Next, as shown in FIG. 31 to FIG. 34, a source/drain region 25 of each of the memory cell transistors MT and the select gate transistors ST1 to ST6 is formed on each of a side wall potion of the memory cell P-type well 13. Specifically, a photoresist is applied over the entire surface, and photoresist openings are formed in the side wall portion of each of the memory cell transistors MT and the select gate transistors ST1 to ST6. Then, with this photoresist, the word lines WL0 to WL15, and the select gate lines SSL1, SSL2, and GSL, ion implantation is performed with an inclination of +7 degrees vertical to the semiconductor substrate 11, whereby the source/drain region 25 is formed in a left portion in FIG. 31 to FIG. 34 of the trench region 14. Subsequently, by performing ion implantation with an inclination of −7 degrees vertical to the semiconductor substrate 11, the source/drain region 25 is formed in a right portion in FIG. 31 to FIG. 34 of the trench region 14. In these cases, for example, N-type impurities such as arsenic (As) and phosphorus (P) are ion-implanted.

Thereafter, an interlayer dielectric 26 is deposited over the entire surface, and openings 27 are formed in the interlayer dielectric 26 in the contact regions of the bit line and the source line. To make a contact region 28 of each of the bit lines BL and the common source line SL less resistant, the N-type impurities such as arsenic (As) and phosphorus (P) are diffused again on both side walls of the trench region 14.

Then, as shown in FIG. 3 to FIG. 6, by filling a metal layer in the shape of a plug into the opening 27 formed in each of the contact region portions of the bit lines BL and the common source line SL, the metal layer 29 shown in FIG. 5 is formed and the common source line SL shown in FIG. 6 is formed. As this metal layer, for example, tungsten (W) is used. Subsequently, an interlayer dielectric 30 is deposited over the entire surface and openings 31 are formed in this interlayer dielectric 30. The openings 31 are formed in the bit line contact regions and source line shunt regions (not illustrated).

A metal layer is then formed on the interlayer dielectric 30 and patterned, thereby forming the bit lines BL and source lines (not illustrated). Although the source lines are not illustrated, they are formed parallel to the bit lines BL at the intervals of a plurality of columns, for example, 64 columns. Finally, by covering the whole with a protective film 33, the nonvolatile semiconductor memory is obtained.

Next, the operation of the nonvolatile semiconductor memory according to this embodiment will be explained. As shown in FIG. 1, in this embodiment, one bit line BL is shared by two NAND-type memory cell units ND1 and ND2, and hence it is necessary to select either one of the NAND-type memory cell unit ND1 or ND2 by the use of the select gate transistors ST1 to ST4 on the occasion of reading and writing. Except for this point, the operation of the nonvolatile semiconductor memory according to this embodiment is basically the same as the operation of an ordinary nonvolatile semiconductor memory. Based on FIG. 35, the operation of this nonvolatile semiconductor memory will be explained below, divided into an erase operation, a read operation, and a write operation.

(Erase Operation)

In the NAND-type EEPROM, the erase operation is performed in each block as a unit. One block is composed of the memory cell transistors MT to which the word lines WL0 to WL 15 are respectively connected in common. In other words, the erase operation is performed for the memory cell transistors MT of a plurality of NAND-type memory cell units in one block all at once.

Namely, as shown in FIG. 35, the word lines WL0 to WL15 in a selected block are set at a ground electric potential. On this occasion, the word lines WL0 to WL15 in a non-selected block are set in a floating state. Then, an erase pulse of 21 V and 3 ms is applied to the memory cell P-type well 13 (a bulk). Consequently, in the selected block, an erase voltage of 21 V is added between the bulk and the word lines WL0 to WL15 so that electrons in the floating gates FG flow into the memory cell P-type well 13 side by an FN tunnel current. Hence, a threshold voltage of each of the memory cell transistors MT is about −3 V.

Since excessive erase is insignificant in the NAND-type EEPROM, erase is performed deeply to abut −3 V with one erase pulse in the memory cell transistor MT. On the other hand, the non-selected block is not affected by the erase pulse because of capacitance coupling of the word lines WL0 to WL15 in the floating state and the memory cell P-type well 13 to which the erase voltage of 21 V is applied. Although the word lines WL0 to WL15 in the floating state have junction capacitance and wiring capacitance of various kinds, the capacitance between the word lines WL0 to WL15 and the memory cell P-type well 13 is conspicuously large so as to occupy a greater part of the total capacitance. Accordingly, the FN tunnel current is prevented from flowing in the non-selected block. In erase verification, it is determined whether or not a threshold voltage of each of all the memory cell transistors MT reaches −1 V or less.

(Read Operation)

The read operation is performed in each page as a unit. One page is a range connected to one of the word lines WL0 to WL 15 in one block. Accordingly, in the read operation, cell data on the memory cell transistors MT of one page are simultaneously transferred to a latch circuit in a page buffer and successively read out.

It should be mentioned that the operation of an EPROM provided with the select gate transistors ST1 to ST4 on the bit line BL side is described in "A High Density EPROM Cell and Array" by R. Stewart et al. in Symp. VLSI Circuits Dig. Tech. Papers, pp. 89–90, June 1987.

Namely, the bit line BL is set temporarily at 0 V, the select gate line SSL1 is set at 0 V, the select gate line SSL2 is set as 4.5 V, and the select gate line GSL is set at 4.5 V. Thereby, in FIG. 1, the select gate transistor ST3 is in an ON-state, and the select gate transistor ST2 is in an OFF-state. As a result, the NAND-type memory cell unit ND1 side is selected, and the NAND-type memory cell unit ND2 side is not selected. Contrary to this, when the NAND-type memory cell unit ND2 side is selected, it is recommended that the select gate line SSL1 be set at 4.5 V and the select gate line SSL2 be set at 0 V.

Thereafter, the selected word line WLi in a selected block is set at 0 V, and the non-selected word lines WL0 to WL15 (except WLi) is set at 4.5V which is a pass voltage. The threshold voltage after writing of the memory transistors MT (after storing an electric charge) in this embodiment is about +2V, and hence the non-selected memory cell transistors MT in the NAND-type memory cell unit ND1 function as pass transistors. Meanwhile, the memory transistor MT to which a voltage of 0 V is applied and which is selected is conductive only after erase (when an electric charge has not been stored yet), while it is not conductive after writing (after storing the electric charge). For this reason, after erase (when the electric charge has not been stored yet), the bit line BL forms a pass which is grounded to the common source line SL via the selected memory cell transistor MT. On the other hand, after writing (after storing the electric charge), a pass in an open state is formed without the bit line BL being grounded.

Incidentally, in this embodiment, a state after erase (when the electric charge has not been stored yet) in the memory cell transistor MT is taken as "1", and a state after writing (after storing the electric charge) is taken as "0". The relation between "1" and "0", however, may be reverse.

Subsequently, a load current of 2 $\mu$A is applied to the bit line BL. Since the load current flows into the common source line SL in the bit line BL which reads out data from the NAND-type memory cell unit ND1 after erase (when the electric charge has not been stored yet), the electric potential of this bit line BL reaches a low level of about 7 V. On the other hand, since the load current does not flow into the common source line SL in the bit line BL which reads out the data from the NAND-type memory cell unit ND1 after writing (after storing the electric charge), the electric potential of this bit line BL reaches a high level of about 1.8 V. The electric potential of this bit line BL is sensed by the latch circuit and stored.

(Write Operation)

In the write operation, write data are continuously loaded on a page buffer. "0" is cell data to perform writing and means that an electric charge is stored in the floating gate FG. "1" is cell data to prohibit writing and means that no electric charge is stored in the floating gate FG. The write operation is repeated until all the cell data "0" are written.

This write operation is roughly divided into a write period and a verify period. First, the operation during the write period will be explained based on FIG. 36.

Figure 36:
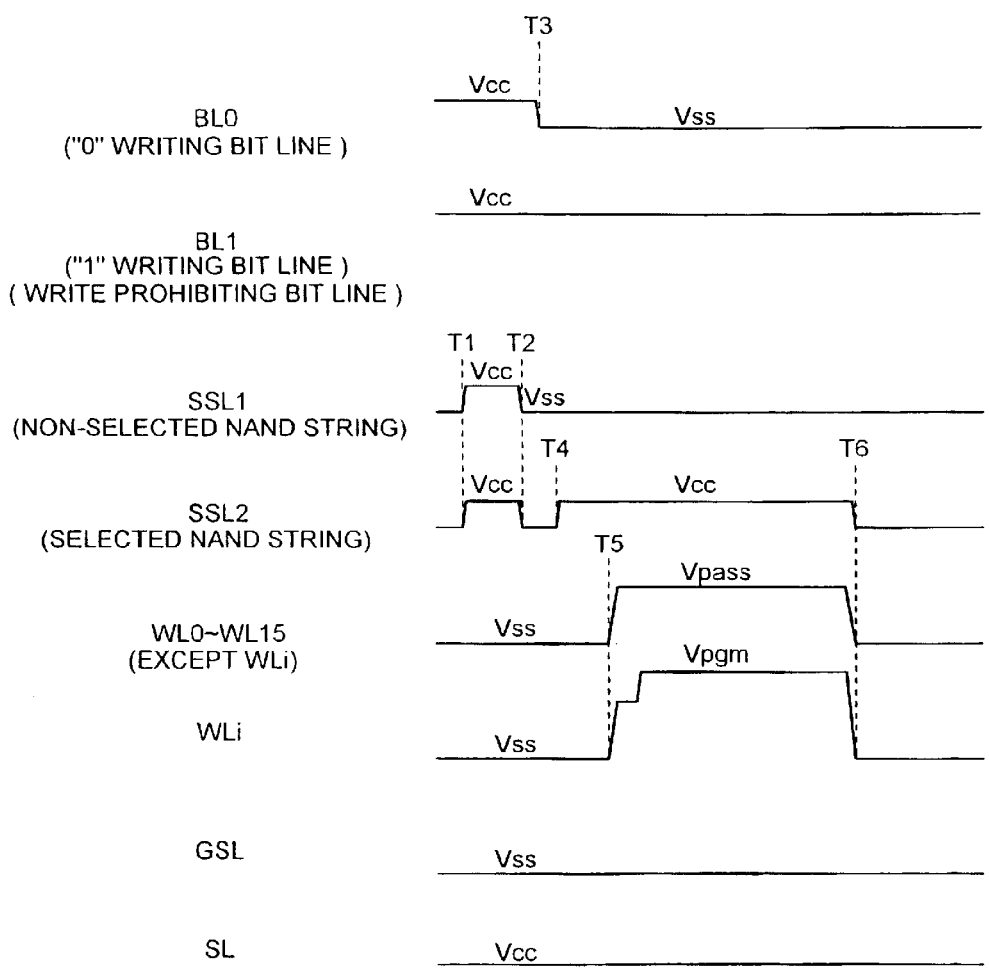
FIG. 36 is a timing chart showing voltage relationship during an actual write period in a write operation (when a channel region is preliminarily charged from the bit line side)

FIG. 36 is a timing chart showing the voltage relationship between signal lines in the write period of the write operation. As shown in FIG. 36, at a point in time T1, the select gate lines SSL1 and SSL2 are set at Vcc (=3.5 V), and a bit line BL0 which writes "0", and a bit line BL1 which writes "1" are set at Vcc (=3.5 V). Hence, the select gate transistors ST1 to ST4 are in an ON-state, and all channel regions of the NAND memory cell units ND1 and ND2 are charged with a spare voltage.

Thereafter, at a point in time T2, the select gate lines SSL1 and SSL2 are set at Vss (=0 V), and the select gate transistors ST2 and ST3 are set in an OFF-state. Then, at a point in time T3, the bit line BL0 to write "0" is set at Vss (=0 V). At a point in time T4, the select gate line SSL2 is set at Vcc (=3.5 V). Thereby, the select gate transistor ST3 is in an ON-state, and only the NAND-type memory cell unit ND1 is selected since the select gate transistor ST1 is of a depletion type.

Subsequently, at a point in time T5, the selected word line WLi is set at Vpgm (=18 V), and the non-selected word lines WL0 to WL15 (except WLi) are set at Vpass (=10 V). As a result, a channel region of the memory cell transistor MT in which "0" is to be written is grounded at the voltage (Vss) of the bit line BL0, and an electric charge is stored in the floating gate FG. Meanwhile, a channel region of the memory cell transistor MT in which "1" is to be written is in a high floating state by the voltage (Vcc) of the bit lint BL1, and no electric charge is stored in the floating gate FG. Namely, an erase state is maintained. Moreover, a channel region of the memory cell transistor MT in the NAND-type memory cell unit ND2 which is not selected is also in a high floating state, whereby an existing state is maintained.

The state at the point in time T5 lasts till a point in time T6, and at the point in time T6, the select gate line SSL2 is set at Vss (=0 V), and the word lines WL0 to WL15 are set at Vss (=0 V).

In the aforesaid operation, a period from the point in time T1 to the point in time T3 is (1) a bit line set up time, which is about 8 $\mu$s. A period from the point in time T4 to the point in time T6 is (2) an actual write time, which is about 20 $\mu$s.

Next, a verify period after writing will be explained. This verify period after writing is composed of a word line discharge time and an actual verify time. The word line discharge time is to discharge a high electric potential of the selected word line WLi and prepare for the input of a succeeding low verify potential, which is about 4 $\mu$s. The actual verify time is to check whether a threshold voltage of the memory cell transistor MT in which writing has been performed is written to an extent equal to or more than a target value, that is, whether an electric charge is stored in the floating gate FG.

In the verify period after writing, as for the memory cell transistor MT in which writing has been necessarily and sufficiently performed, that is, the memory cell transistor MT in which an electric charge is stored in the floating gate FG to a necessary and sufficient extent, it is required to prevent excessive writing. Therefore, as for the memory cell transistor MT in which writing has been necessarily and sufficiently performed, data held by a latch circuit of cell data in the page buffer are changed from "0" to "1". Thereby, when writing is performed again with respect to the memory cell transistor MT in which writing is insufficient, the threshold voltage of the memory cell transistor MT which has already reached a necessary and sufficient value is prevented from increasing further.

A bias condition in the verify operation is almost the same as that in the aforesaid read operation, but differs therefrom in that the cell data are held in the latch circuit in the page buffer and a voltage of 0.7 V is applied to the selected word line WLi. Under this condition, when the threshold voltage of the memory cell transistor MT in which writing has been performed exceeds 0.7 V, that is, when writing is necessarily and sufficiently performed, data in the latch circuit in the page buffer are changed from "0" to "1". As for the latch circuit in which "1" is loaded as the cell data for writing, the data in the latch circuit only changes from "0" to "1", whereby this latch circuit receives no influence in the verify operation.

The write operation composed of the aforesaid write period and verify period is repeated until all the data in the latch circuit in the page buffer turn into "1" or until it reaches the maximum write time of 10 cycles.

Figure 37:
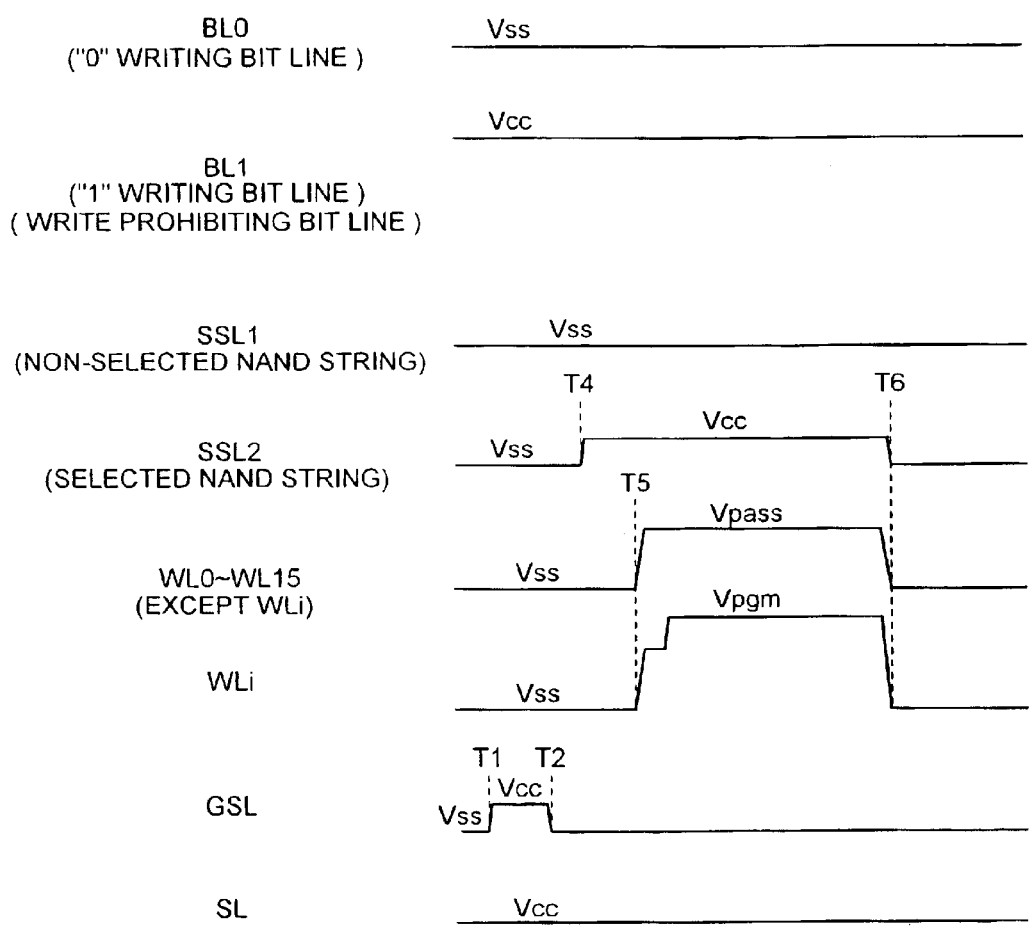
FIG. 37 is a timing chart showing voltage relationship during an actual write period in a write operation (when the channel region is preliminarily charged from the source line side)

Incidentally, a charge of a spare voltage is given from the bit line BL side to the channel regions of the NAND-type memory cell units ND1 and ND2 in the write operation in FIG. 36, while a charge of a spare voltage may be given from the common source line SL side as shown in FIG. 37. In this case, from a point in time T11 to a point in time T12, the select gate line GSL is at Vcc (=3.5 V), and the select gate transistors ST5 and ST6 are in an ON-state. During this period of time, the select gate lines SSL1 and SSL2 are maintained at Vss (=0 V), whereby the select gate transistors ST1 to ST4 are in an OFF-state. Therefore, the supply and charge of a spare voltage are performed from the common source line SL to the channel regions of the memory cell transistors MT.

Next, a bias condition on a write prohibiting voltage to be supplied to a channel of a selected cell will be explained. If the NAND-type memory cell unit ND1 in FIG. 1 is selected as described above, the select gate transistors ST1 and ST2 on the bit line BL side are in a conduction state, the select gate transistor ST5 on the source line SL side is in a non-conduction state, the bit line BL0 having the memory cell transistor MT in which writing is performed is set at 0 V, and the bit line BL1 having the memory cell transistor MT in which writing is prohibited is set at Vcc (=3.5).

Since the bit line BL0 having the memory cell transistor MT in which writing is performed is set at 0 V, each channel of its NAND-type memory cell unit ND1 has a ground potential. Since the bit line BL1 having the memory cell transistor MT in which writing is prohibited is set at Vcc (=3.5 V), the channels of its NAND-type memory cell unit ND1 are preliminarily charged. When a write voltage Vpgm is inputted to the selected word line WLi and a pass voltage Vpass (=10 V) is inputted to the non-selected word lines WL0 to WL15 (except WLi), a capacitance of channel is automatically increased in voltage by series coupling of capacitances via the word lines WL0 to WL15, the floating gate FG, the channel, and the memory cell P-type well. As described above, the channel potential of the NAND-type memory cell unit ND1 in which writing is prohibited in the selected block is determined by capacitance coupling of the word lines and the channels. Accordingly, in order to sufficiently increase a write prohibiting potential, it is important to perform sufficient initial charge of the channels and to increase a capacitance coupling ratio among the channels of the word lines WL0 to WL15.

A coupling ratio B among the word lines WL0 to WL15 is calculated as follows:

$$B = Cox/(Cox+Cj)$$

where Cox is a total of gate capacitances between the word lines WL0 to WL15 and the channels and Cj is a total of junction capacitances of sources and drains of the memory cell transistors MT. A channel capacitance of the NAND-type memory cell unit ND1 is a sum of the total Cox of gate capacitances and the total Cj of junction capacitances. Moreover, other capacitances such as an overlap capacitance of sources in the select gate transistors ST1, ST3, and ST5, and capacitances between the bit line BL, and the source line SL and the drains are very small compared with the whole channel capacitances, and hence neglected here.

As described above, according to the nonvolatile semiconductor memory in this embodiment, the NAND-type EEPROM is three-dimensionally made, whereby the size of a cell can be reduced by half, resulting in a reduction in bit cost. Namely, since two NAND-type memory cell units ND1 and ND2 are disposed in one bit line pitch 2 F, the cell size can be reduced by half.

Figure 42:
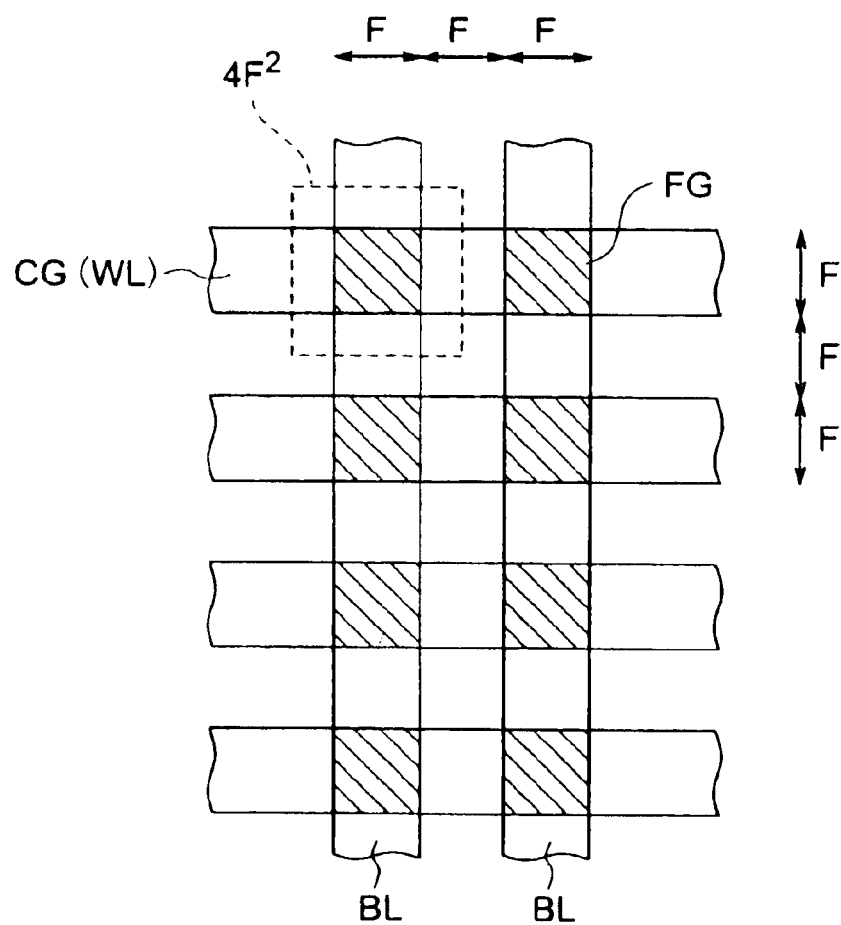
FIG. 42 is a schematic diagram showing a memory cell transistor portion of the related NAND-type memory cell unit in plan view.
Figure 43:
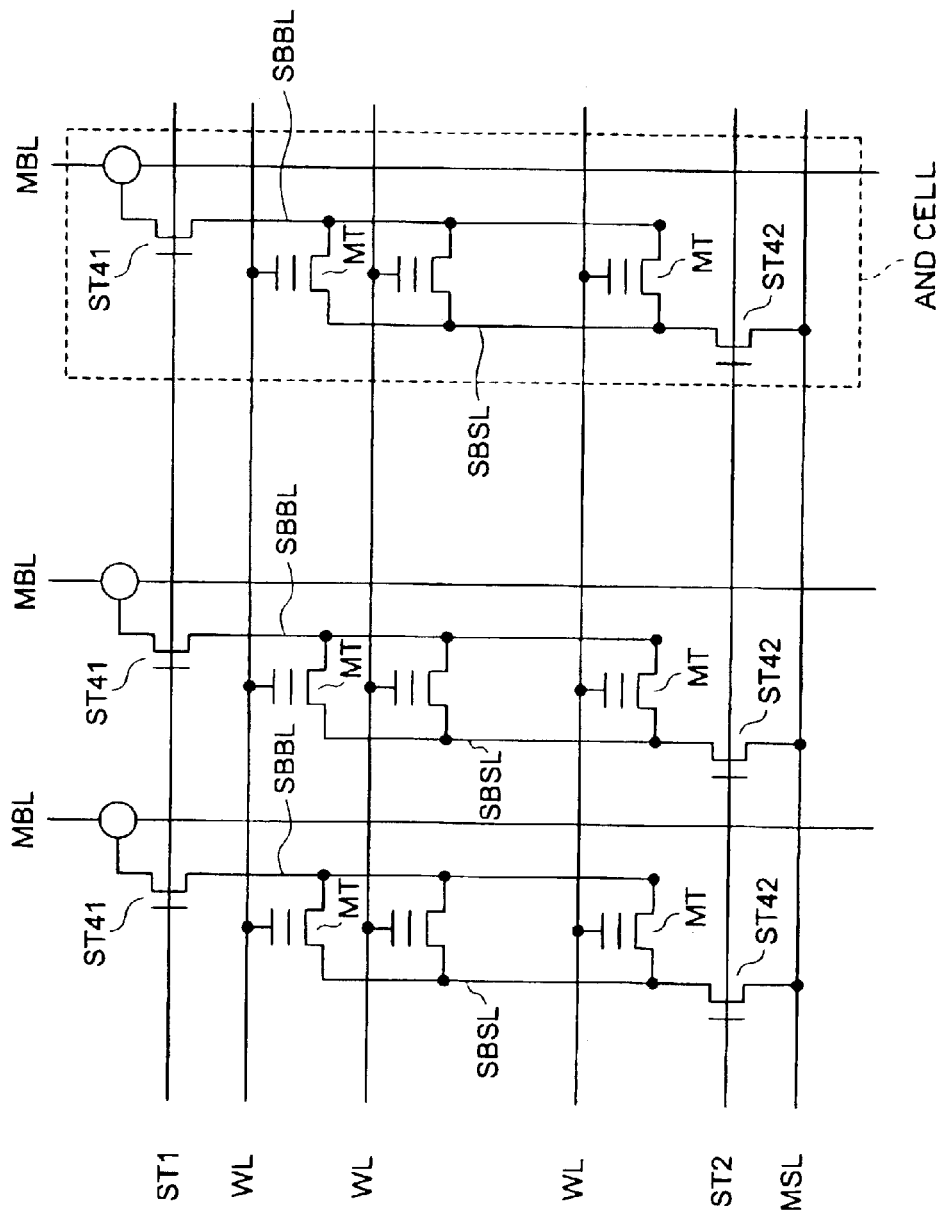
FIG. 43 is an equivalent circuit diagram showing the interconnection of a related AND cell.
Figure 44:
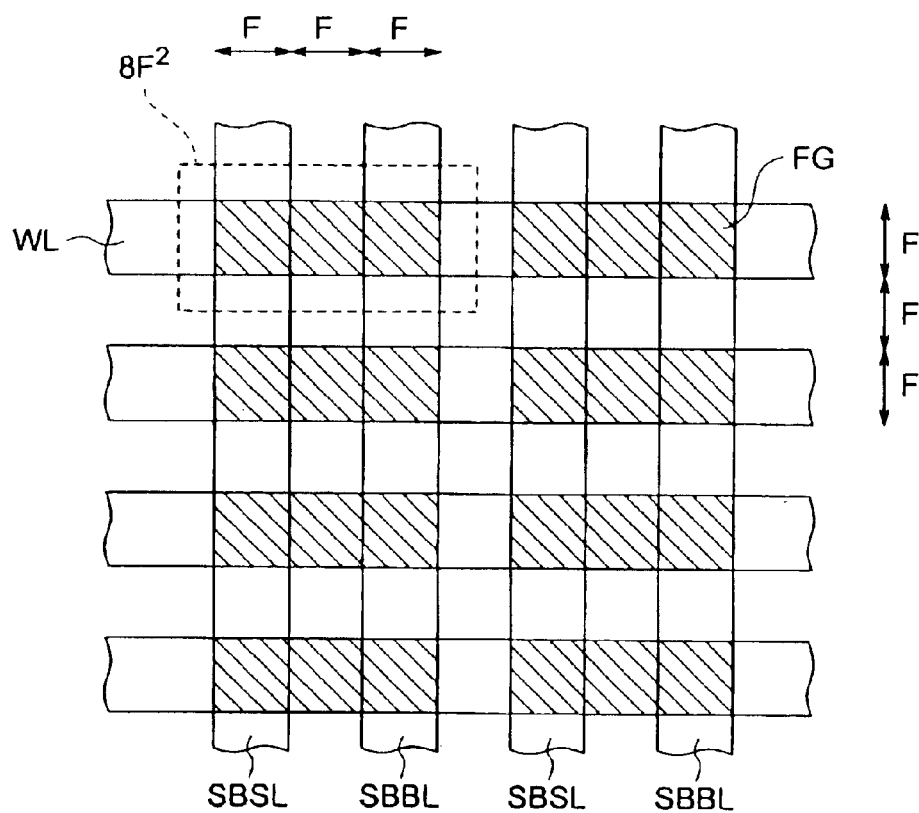
FIG. 44 is a schematic view showing a memory cell transistor portion of the related AND cell in plan view.

More specifically, as shown in FIG. 42, the substantial memory cell size of the related NAND-type EEPROM is 4 $F^2$+$\alpha$ obtained by adding a bit line contact, a source contact, and the select gate transistors ST1 and ST2 to a bit line BL pitch 2 Fxa word line WLi pitch 2 F=4 $F^2$. This 4 $F^2$+$\alpha$ is about 5 $F^2$. As against this, in the NAND-type EEPROM according to this embodiment, as shown in FIG. 2, its substantial memory cell size is 2 $F^2$+$\alpha$ obtained by adding a bit line contact, a source contact, and the select gate transistors ST1 and ST6 to a bit line BL pitch F×a word line WLi pitch 2 F=2 F². This 2 F²+α is about 2.5 F². Thus, the substantial memory cell size can be reduced by half compared with the related one.

As shown in FIG. 3B, the control gate CG and the polysilicon 22 are formed out of a polysilicon with a relatively high resistivity, and the word lines WL0 to WL15 are formed out of a metal layer with a resitivity lower than the polysilicon. Consequently, the resistance of the word lines WL0 to WL15 can be reduced while a coupling ratio of the channel region to the floating gate FG in the memory cell transistor MT is kept large. The aforesaid reduction in the resistance of the word lines WL0 to WL15 makes it possible to secure the high-speed property of the operation of the nonvolatile semiconductor memory.

Further, as shown in FIG. 2 and FIG. 4, in the select gate transistors ST1 to ST6, the inter-poly insulating film 19 is removed. Therefore, the gate electrode GE and the polysilicon 22 can be electrically connected directly, whereby it becomes unnecessary to form a shunt which electrically connects the gate electrode GE and each of the select gate lines SSL1 and SSL2 which has been hitherto necessary. As a result, an unnecessary shunt region can be omitted, leading to a reduction in manufacturing cost.

Figure 38:
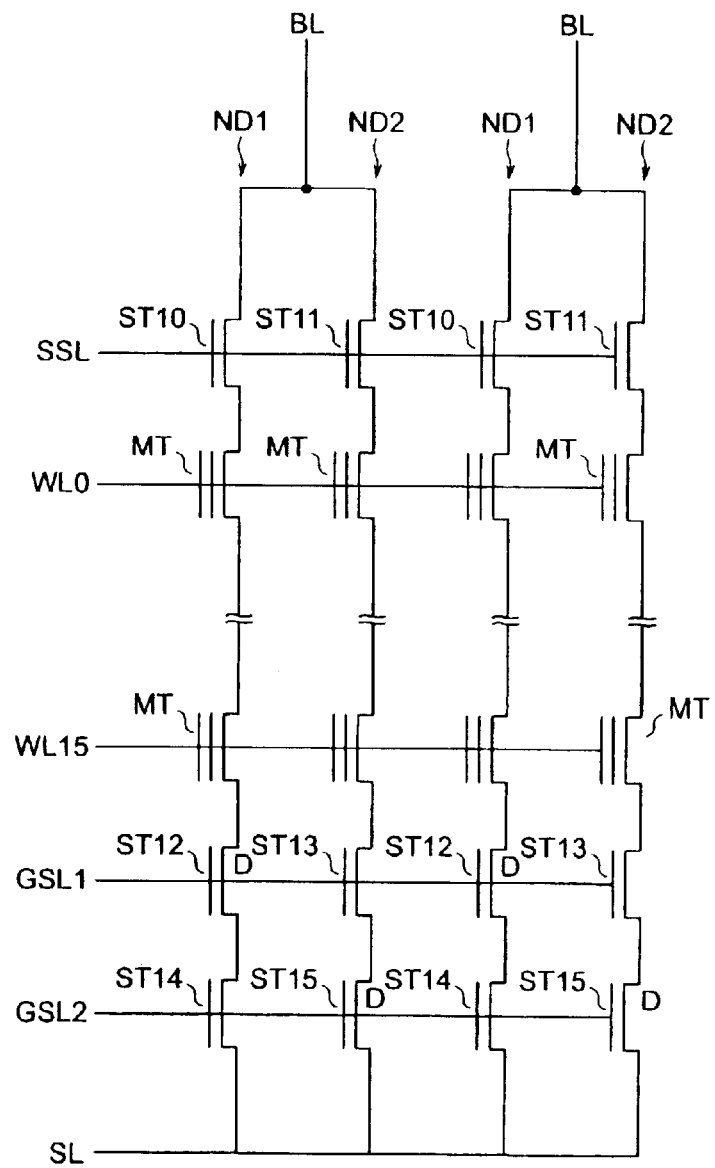
FIG. 38 is a circuit diagram when the NAND-type memory cell unit shown in FIG. 1 is modified and two select gate transistors are provided on the source line side.

It should be mentioned that the present invention is not limited to the aforesaid embodiment and can be modified variously. For example, although two select gate transistors ST1 and ST3 (ST2 and ST4) as the bit line side switching portion are provided on the bit line BL side of the NAND-type memory cell unit ND1 (ND2) and one select gate transistor ST5 (ST6) as a source line side switching portion is provided on the common source line SL side as shown in FIG. 1 in the aforesaid embodiment, the numbers of select gate transistors in these bit line side switching portion and source line side switching portion may be reversed. Namely, as shown in FIG. 38, it is suitable to provide one select gate transistor ST10 (ST11) as the bit line side switching portion on the bit line BL side of the NAND-type memory cell unit ND1 (ND2) and to provide two select gate transistors ST12 and ST14 (ST13 and ST15) as the source line side switching portion on the source line SL side. In this case, it is recommended that the select gate transistor ST12 (ST15) be of a depletion type, and that the select gate transistor ST10 (ST11) and the select gate transistor ST14 (ST13) be of a enhancement type. In this case, a schematic diagram showing a cross section of the select gate transistors ST12 and ST13 are like FIG. 4.

Figure 39:
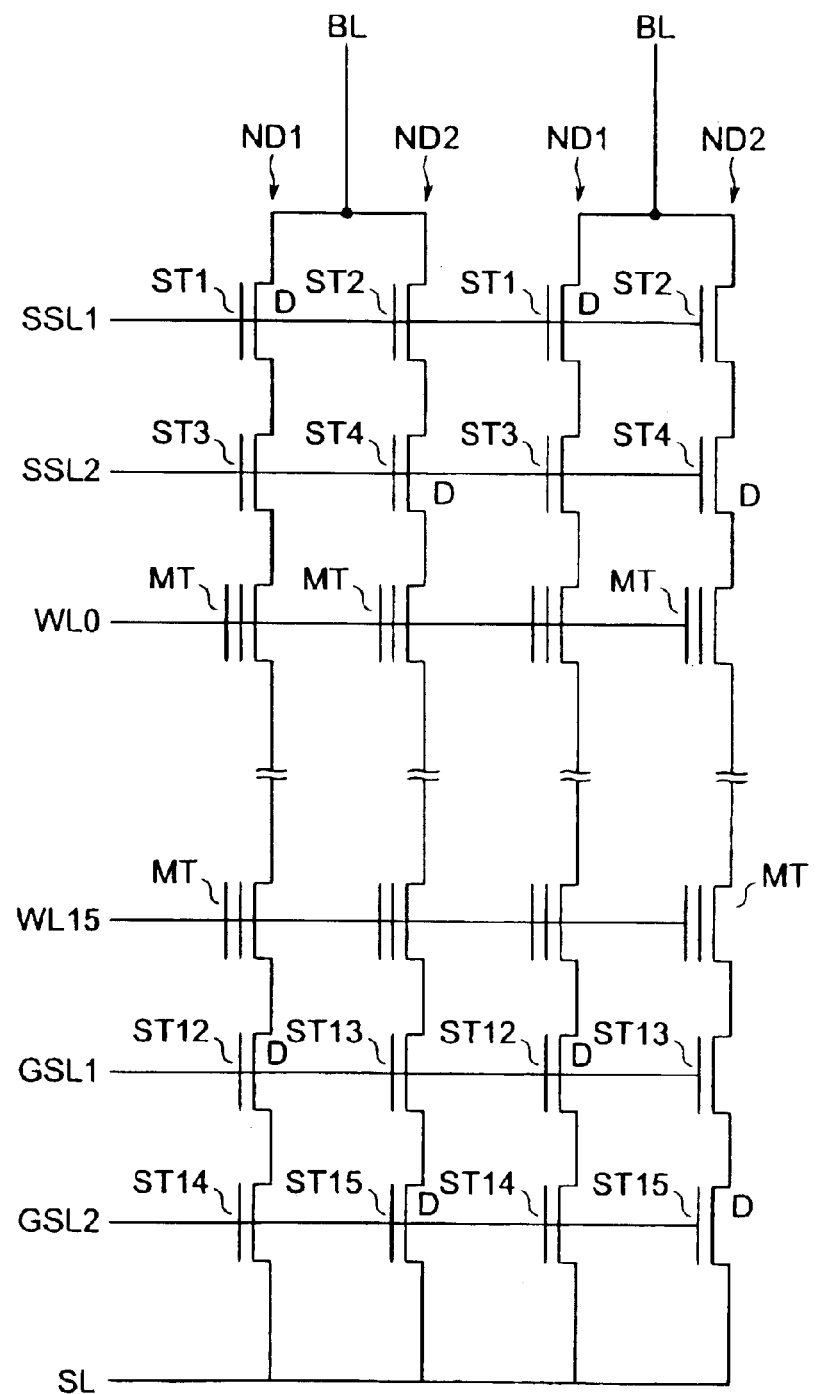
FIG. 39 is a circuit diagram when the NAND-type memory cell unit shown in FIG. 1 is modified, two select gate transistors are provided on the bit line side, and two select gate transistors are provided also on the source lined side.
Figure 41:
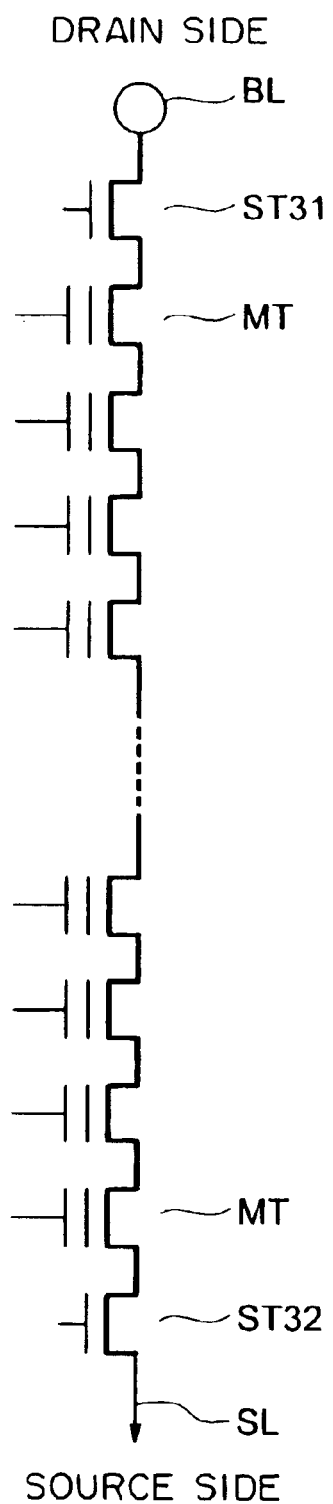
FIG. 41 is an equivalent circuit diagram showing the interconnection of a related NAND-type memory cell unit.

Furthermore, as shown in FIG. 39, it is also suitable to provide two select gate transistors ST1 and ST3 (ST2 and ST4) as the bit line side switching portion and to provide two select gate transistors ST12 and ST14 (ST13 and ST15) as the source line side switching portion.

Moreover, as shown in FIG. 40, if the disposition of the bit lines BL permits, it is possible to provide only enhancement-type select gate transistors ST20 (ST21) and ST5 (ST6) respectively in the bit line side switching portion and the source line side switching portion in the vertical NAND-type memory cell unit ND1 (ND2) without using the depletion-type select gate transistor as described above.

When 4 G (giga) or 16 Gbits NAND-type EEPROM is designed by a 0.1 μm rule, in FIG. 2 and FIG. 3, the width of the trench region 14 is 0.1 μm, thin oxide films 17 with a thickness of 8 nm are formed on both side wall portions inside the trench region 14, two floating gates FG 10 nm in thickness are formed on inner sides of both the thin oxide films 17, the inter-poly insulating film 19 with a thickness of 20 nm is formed to cover the floating gates FG, and the one control gate CG 24 nm in thickness is filled therein, thereby composing a pair of memory cell transistors MT and MT. When a design rule finer than the 0.1 μm rule is used, the thin oxide film 17, the floating gate FG, the inter-poly insulating film 19, and the control gate CG are respectively made thinner in moderation.

As explained above, according to the aforesaid embodiment, two NAND-type memory cell units are connected to one bit line, and hence the two NAND-type memory cell units can be formed within a bit line pitch of 2 F, resulting in a reduction in the size of the nonvolatile semiconductor memory.

What is claimed is:

1. A nonvolatile semiconductor memory including a memory cell array having a plurality of memory cell units, one of which has a plurality of rewritable nonvolatile memory cell transistors connected in series, said nonvolatile memory cell transistors comprising:

a first insulating film formed on a substrate;

at least two charge storage layers formed on the first insulating film;

a control gate shared by two adjacent transistors which are two of the nonvolatile memory cell transistors and which are adjacent to each other, a top of the control gate having a flat surface that covers the at least two charge storage layers that correspond to the two adjacent transistors, the flat surface extending from one of the at least two charge storage layers to the other of the at least two charge storage layers; and a second insulating film formed between the at least two charge storage layers and the control gate, both of a bottom of the at least two charge storage layers and a bottom of the second insulating film being on a face which is substantially flat.

2. The nonvolatile semiconductor memory according to claim 1, wherein the first insulating film is on a face which is substantially perpendicular to the surface of the substrate.

3. The nonvolatile semiconductor memory according to claim 1, wherein source/drain regions are formed on a face which is substantially perpendicular to the surface of the substrate.

4. The nonvolatile semiconductor memory according to claim 1, wherein the two adjacent transistors are adjacent to each other in a first direction which intersects with a second direction of forming the memory cell unit.

5. The nonvolatile semiconductor memory according to claim 4, wherein the first insulating film is on a face which is substantially perpendicular to the surface of the substrate.

6. The nonvolatile semiconductor memory according to claim 4, wherein source/drain regions are formed on a face which is substantially perpendicular to the surface of the substrate.

7. The nonvolatile semiconductor memory according to claim 1, wherein a bottom of the control gate faces the surface of the substrate via the second insulating film.

8. A nonvolatile semiconductor memory including a memory cell array having a plurality of memory cell units including a first memory cell unit, a second memory cell unit, a third memory cell unit and a fourth memory cell unit, each of the first memory cell unit, the second memory cell unit, the third memory cell unit and the fourth memory cell unit has a plurality of rewritable nonvolatile memory cell transistors connected in series, said nonvolatile memory cell transistors of the first memory cell unit and the second memory cell unit comprising:

a substrate having a surface;

a first insulating film formed on the surface of the substrate;

a first charge storage layer formed on the first insulating film;

a first control gate shared by two adjacent transistors which are two of the nonvolatile memory cell transistors of the first memory cell unit and the second memory cell unit and which are adjacent to each other; and a second insulating film formed between the first charge storage layer and the first control gate, both of a bottom of the first charge storage layer and a bottom of the second insulating film being on a first face which is substantially flat, and said nonvolatile memory cell transistors of the third memory cell unit and the fourth memory cell unit comprising:

a third insulating film formed on the substrate;

a second charge storage layer formed on the third insulating film;

a second control gate shared by two adjacent transistors which are two of the nonvolatile memory cell transistors of the third memory cell unit and the fourth memory cell unit and which are adjacent to each other, the second control gate being electrically separated from the first control gate; and a fourth insulating film formed between the second charge storage layer and the second control gate, both of a bottom of the second charge storage layer and a bottom of the fourth insulating film being on a second face which is substantially flat.

9. The nonvolatile semiconductor memory according to claim 8, wherein the first insulating film and the third insulating film are on a face which is substantially perpendicular to the surface of the substrate.

10. The nonvolatile semiconductor memory according to claim 8, wherein source/drain regions are formed on a face which is substantially perpendicular to the surface of the substrate.

11. The nonvolatile semiconductor memory according to claim 8, wherein the two adjacent transistors of the first memory cell unit and the second memory cell unit are adjacent to each other in a first direction which intersects with a second direction of forming the memory cell units.

12. The nonvolatile semiconductor memory according to claim 11, wherein the first insulating film and the third insulating film are on a face which is substantially perpendicular to the surface of the substrate.

13. The nonvolatile semiconductor memory according to claim 11, wherein source/drain regions are formed on a face which is substantially perpendicular to the surface of the substrate.

14. The nonvolatile semiconductor memory according to claim 8, wherein a bottom of the first control gate faces the surface of the substrate via the second insulating film.

15. A nonvolatile semiconductor memory including a memory cell array having a plurality of memory cell units, one of which has a plurality of rewritable nonvolatile memory cell transistors connected in series, said nonvolatile memory cell transistors comprising:

a substrate having a surface;

a first insulating film formed on the surface of the substrate;

at least two charge storage layers formed on the first insulating film;

a control gate shared by two adjacent transistors which are two of the nonvolatile memory cell transistors and which are adjacent to each other, and a top of the control gate has a continuous flat surface that covers the at least two charge storage layers that correspond to the two adjacent transistors, and the continuous flat surface extends from one of the at least two charge storage layers to the other of the at least two charge storage layers; and a second insulating film formed between the at least two charge storage layers and the control gate, both of a bottom of the at least two charge storage layers and a bottom of the second insulating film being on a face which is substantially parallel with a surface of the substrate.

16. A nonvolatile semiconductor memory including a memory cell array having a plurality of memory cell units, one of which has a plurality of rewritable nonvolatile memory cell transistors connected in series, said nonvolatile memory cell transistors comprising:

a first insulating film formed on a substrate;

at least two charge storage layers formed on the first insulating film;

a control gate shared by two adjacent transistors which are two of the nonvolatile memory cell transistors and which are adjacent to each other, a top of the control gate having a continuous flat surface that covers the at least two charge storage layers that correspond to the two adjacent transistors, the continuous flat surface extending from one of the at least two charge storage layers to the other of the at least two charge storage layers; and a second insulating film formed between the at least two charge storage layers and the control gate, both of a bottom of the at least two charge storage layers and a bottom of the second insulating film being on a face which is substantially flat.

* * * * *